US006915081B2

(12) United States Patent
Takeshita et al.

(10) Patent No.: US 6,915,081 B2
(45) Date of Patent: Jul. 5, 2005

(54) PLL CIRCUIT AND OPTICAL COMMUNICATION RECEPTION APPARATUS

(75) Inventors: Toru Takeshita, Kanagawa (JP); Takashi Nishimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 642 days.

(21) Appl. No.: 09/978,058

(22) Filed: Oct. 17, 2001

(65) Prior Publication Data
US 2002/0057479 A1 May 16, 2002

(30) Foreign Application Priority Data

Oct. 19, 2000 (JP) ..................................... P2000-318903
Jan. 12, 2001 (JP) ..................................... P2001-004617

(51) Int. Cl.[7] ........................ H04B 10/00; H04B 10/12; H04B 10/04
(52) U.S. Cl. ........................ 398/188; 398/150; 398/154; 398/155
(58) Field of Search ................................ 398/150, 154, 398/155, 187, 188, 197, 201; 375/375, 376, 294; 327/147, 156; 329/325

(56) References Cited

U.S. PATENT DOCUMENTS

| 5,727,019 A | * | 3/1998 | Tatsumi ........................ 375/222 |
| 5,889,828 A | * | 3/1999 | Miyashita et al. ........... 375/374 |
| 6,081,572 A | | 6/2000 | Filip |
| 6,333,678 B1 | * | 12/2001 | Brown et al. .................... 331/2 |
| 6,353,358 B1 | * | 3/2002 | Yoshie ......................... 329/307 |
| 6,556,086 B2 | * | 4/2003 | Keaveney et al. ........... 331/1 A |

OTHER PUBLICATIONS

Hui Wang and Richard Nottenburg: XP–000862367; A 1Gb/s CMOS Clock and Data Recovery Circuit; dated Feb. 1999, vol.42, pp. 354–355.
Hui Wang and Richard Nottenburg: A CMOS Low–jitter Phase Frequency Detector for Giga–bit/s Clock Recovery; dated Jul. 1999; pp. 91–93.
T.H. Toifl and P. Moreira: Simple frequency detect or circuit for biphase and NRZ clock recovery: dated Oct. 1, 1998 vol. 34, No. 20; pp. 1922–1923.

* cited by examiner

Primary Examiner—Leslie Pascal
Assistant Examiner—Dzung Tran
(74) Attorney, Agent, or Firm—Ronald P. Kananen; Rader, Fishman & Grauer PLLC

(57) ABSTRACT

The invention provides a PLL circuit wherein, even if the duty ratio of an input signal varies, stabilized PLL operation is achieved. The PLL circuit includes a phase detection circuit and a frequency detection circuit. The frequency detection circuit includes a pair of D-type flip-flops for sampling first and second clock signals having different phases from each other in synchronism with an input signal at each rising or falling changing point of the input signal for each period, and a control logic circuit for logically operating the signals sampled by the D-type flip-flops and the signals sampled successively subsequently by the D-type flip-flops. The control logic circuit generates an UP pulse signal or a DOWN pulse signal based on a result of the arithmetic operation.

18 Claims, 12 Drawing Sheets

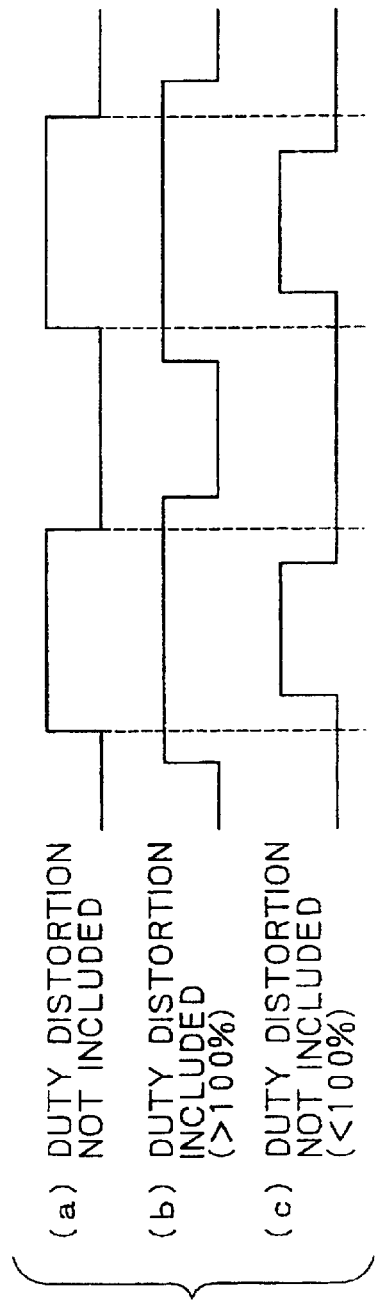
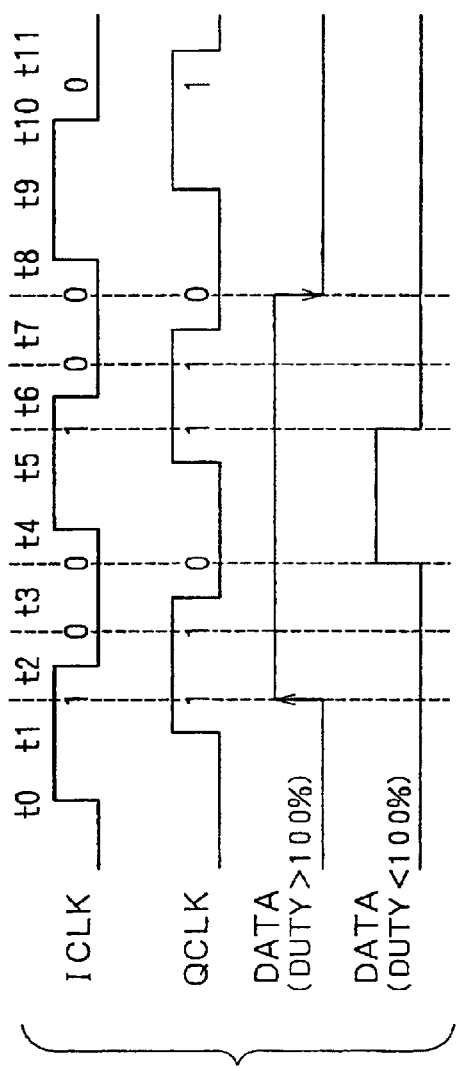

PLL CIRCUIT AND OPTICAL COMMUNICATION RECEPTION APPARATUS

BACKGROUND OF THE INVENTION

This invention relates to a PLL (Phase Locked Loop) circuit and an optical communication reception apparatus, and more particularly to a PLL circuit which includes a phase detection circuit and a frequency detection circuit and an optical communication reception apparatus which uses a PLL circuit as a production circuit for a clock signal to be used for retiming processing of receive data.

FIG. 11 shows a configuration of a PLL circuit which is used commonly. Referring to FIG. 11, the PLL circuit shown includes a phase detection (PD) circuit 101 and a frequency detection (FD) circuit 102 and operates in the following manner.

First, the frequency detection circuit 102 performs phase comparison between an input signal DATA and clock signals (ICLK, QCLK). Then, the frequency of a frequency clock VCOCLK of a voltage-controlled oscillator (VCO) 106 is controlled through a charge pump (CP) circuit 104 and a loop filter 105 based on a result of the comparison to pull the oscillation frequency of the VCO 106 to a target oscillation frequency. The clock signals (ICLK, QCLK) are produced based on the oscillation frequency clock VCOCLK of the VCO 106 by a clock generator 107.

Then, the phase detection circuit 101 performs phase comparison between the input signal DATA and the oscillation frequency clock VCOCLK of the VCO 106. Then, the phase detection circuit 101 controls the phase of the oscillation frequency clock VCOCLK of the VCO 106 through another charge pump circuit 103 and the loop filter 105 based on a result of the comparison to cause the phase of the frequency clock VCOCLK of the VCO 106 to align with the phase of the input signal DATA.

In a PLL circuit of the type described, a frequency comparison circuit of such a configuration as shown in FIG. 12 is conventionally used for the frequency detection circuit 102. In the following, a detailed circuit configuration and operation of the frequency detection circuit 102 are described.

It is assumed here that the digital signal DATA inputted to the frequency detection circuit 102 has a non-return-to-zero (NRZ) waveform. It is also assumed that the clock generator 107 divides the oscillation frequency clock VCOCLK of the VCO 106 to a predetermined dividing ratio 1/n (in the example described, n=1) to produce the clock signal ICLK and shifts the phase of the clock signal ICLK by 90 degrees to produce the clock signal QCLK, and the clock signals ICLK and QCLK are inputted to the frequency detection circuit 102.

First, a data input terminal 111 to which the input signal DATA of an NRZ waveform is inputted is connected to the D (data) input terminal of a D-type flip-flop (D-FF) 112 and connected also to an input terminal A of an exclusive OR (EX-OR) gate 113. Meanwhile, an ICLK input terminal 114 to which the clock signal ICLK is inputted is connected to an input terminal A of each of a pair of AND gates 116 and 117 while a QCLK input terminal 115 to which the clock signal QCLK is inputted is connected to the other input terminals B of the AND gates 116 and 117. The input terminal A of the AND gate 117 is a negated input terminal through which the clock signal ICLK is inputted with the reversed polarity.

The output terminals of the AND gates 116 and 117 are connected to the D input terminals of D-FFs 118 and 119, respectively. The output terminal of the EX-OR gate 113 is connected to the CLK input terminals of the D-FFs 118 and 119. The Q output terminals of the D-FFs 118 and 119 are connected to the D input terminals of D-FFs 120 and 121, and the Q output terminals of the D-FFs 120 and 121 are connected to the D input terminals of D-FFs 122 and 123, respectively. The CLK terminals of the D-FF 112 and the D-FFs 120 to 123 are connected to the ICLK input terminal 114.

The Q output terminal of the D-FF 122 is connected to an input terminal A of an AND gate 124. The Q output terminal of the D-FF 123 is connected to an input terminal B of another AND gate 125. The Q output terminal of the D-FF 120 is further connected to an input terminal A of the AND gate 125, and the Q output terminal of the D-FF 121 is connected to an input terminal B of the AND gate 124. The output terminals of the AND gates 124 and 125 are connected to circuit output terminals 126 and 127, respectively.

A DOWN pulse signal for controlling the VCO 106 of FIG. 11 to lower the oscillation frequency of it is extracted as an output signal from the AND gate 124 while an UP pulse signal for controlling the VCO 106 to raise the oscillation frequency is extracted as an output signal from the AND gate 125 The DOWN pulse signal and the UP pulse signal are supplied to the charge pump circuit 104 of FIG. 11 through the circuit output terminals 126 and 127, respectively.

Now, circuit operation of the frequency detection circuit having the configuration described above is described with reference to a timing chart of FIG. 13. In FIG. 13, waveforms (a) to (o) indicate waveforms at nodes (a) to (o) of FIG. 12, respectively.

First, the clock signal ICLK (a) has a pulse waveform wherein it rises to the "H" (high) level at time t0 and falls to the "L" (low) level at time t2. Similarly, the clock signal ICLK (a) rises at times t4, t8, t12, . . . and falls at times t6, t10, . . . . The clock signal ICLK (a) is supplied to the input terminals A of the AND gates 116 and 117 through the ICLK input terminal 114 and supplied also to the CLK terminals of the D-FF 112 and the D-FFs 120 to 123.

The clock signal QCLK (b) has a pulse waveform having a phase shifted by 90 degrees, more particularly, delayed by 90 degrees with respect to the clock signal ICLK (a). In particular, the clock signal QCLK (b) rises to the "H" level at times t1, t5, t9, . . . and falls to the "L" level at times t3, t7, t11, . . . . The clock signal QCLK (b) is supplied to the input terminals B of the AND gates 116 and 117.

The AND gate 116 logically ANDs the clock signal ICLK (a) and the clock signal QCLK (b). Therefore, the output signal (c) of the AND gate 116 exhibits the "H" level within those periods within which both of the clock signals ICLK and QCLK have the "H" level, that is, within the period from time t1 to time t2, the period from time t5 to time t6 and the period from time t9 to time t10. Within the other periods, that is, within the period from time t0 to time t1, the period from time t2 to time t5, the period from time t6 to time t9 and the period from time t10 to time t12, the output signal (c) of the AND gate 116 exhibits the "L" level.

Meanwhile, the AND gate 117 logically ANDs the inverted clock signal ICLKX of the clock signal ICLK (a) and the clock signal QCLK (b). Therefore, the output signal (d) of the AND gate 117 exhibits the "H" level within those periods within which both of the clock signals ICLKX and QCLK have the "H" level, that is, within the period from time t2 to time t3, the period from time t6 to time t7 and the period from time t10 to time t11. Within the other periods, that is, within the period from time t0 to time t2, the period from time t3 to time t6, the period from time t7 to time t10 and the period later than time t11, the output signal (d) of the AND gate 117 exhibits the "L" level.

In the timing chart of FIG. 13, the period within which the output signal (c) exhibits the "H" level is represented as a period A while the period within which the output signal (d) exhibits the "H" level is represented as a period B.

Meanwhile, the NRZ input signal DATA (f) is supplied immediately to the input terminal A of the EX-OR gate 113 through the data input terminal 111 and supplied also to the D input terminal of the D-FF 112. The D-FF 112 fetches the "H" level/"L" level of the input waveform to the D input terminal at the timing of a rising edge of the clock signal ICLK (a). In this instance, if the input signal DATA (f) has the "H" level at time t0, then since the D-FF 112 fetches this, the level of the Q output signal (e) thereof changes to the "H" level.

Then, since the input signal DATA (f) changes between times t1 and t2 and reverses its polarity, the D-FF 112 fetches the input signal DATA (f) of the "L" level and changes its Q output signal (e) to the "L" level at the timing of a next rising edge of the clock signal ICLK (a). Further, since the polarity of the input signal DATA (f) reverses again between times t6 and t7, the D-FF 112 fetches the input signal DATA (f) of the "H" level at the next rising timing t8 of the clock signal ICLK (a) and changes its Q output signal (e) to the "H" level. Thereafter, the D-FF 112 keeps the "H" level until time t12.

The Q output signal (e) of the D-FF 112 is supplied to the input terminal B of the EX-OR gate 113. The EX-OR gate 113 exclusively ORs the Q output signal (e) supplied to the input terminal B and the input signal DATA (f) supplied to the input terminal A. As a result, as can be seen from the timing chart of FIG. 13, the level of the output signal (g) of the EX-OR gate 113 changes from the "L" level to the "H" level when the input signal DATA (f) reverses during the period from time t1 to time t2, and changes back to the "L" level at time t4 at which the Q output signal (e) of the D-FF 112 exhibits a level change to the "L" level.

For the period after time t4 until a next data reversal of the input signal DATA (f), the output signal (g) of the EX-OR gate 113 maintains the "L" level. Then, when the input signal DATA (f) reverses within the period from time t6 to time t7, the output signal (g) of the EX-OR gate 113 exhibits a level change from the "L" level to the "H" level at the timing of the reversal.

Thereafter, at time t8, the level of the Q output signal (e) of the D-FF 112 changes from the "L" level to the "H" level. Consequently, the EX-OR gate 113 logically ORs the "H" level of the input signal DATA (f) and the "H" level of the Q output signal (e), and therefore, the level of the output signal (g) of the EX-OR gate 113 changes to the "L" level. Then, within the following period from time t8 to time t12, the level of the output signal (g) of the EX-OR gate 113 does not exhibit a change.

The output signals (c) and (d) of the AND gates 116 and 117 are inputted to the D input terminals of the D-FFs 118 and 119 in the next stage, respectively. The D-FFs 118 and 119 receive the output signal (g) of the EX-OR gate 113 as inputs to the CLK terminals thereof, and fetch the D input waveforms at the timing of a rising edge of the clock waveform and output the fetched levels as the Q output signals (h) and (k), respectively.

Since the output signal (g) of the EX-OR gate 113 rises within the period from time t1 to time t2 and, within the period, the output signal (c) of the AND gate 116 has the "H", level and the output signal (d) of the AND gate 117 has the "L" level, the Q output signal (h) of the D-FF 118 exhibits the "H" level and the Q output signal (k) of the D-FF 119 exhibits the "L" level.

The timing at which the level of the output signal (g) of the EX-OR gate 113 changes from the "L" level to the "H" level is a changing point of the input signal DATA (f) within the period from time t6 to time t7. Since the output signal (c) of the AND gate 116 has the "L" level and the output signal (d) of the AND gate 117 has the "H" level at the timing, the level of the Q output signal (h) of the D-FF 118 changes from the "H" level to the "L" level and the level of the Q output signal (k) of the D-FF 119 changes from the "L" level to the "H" level. Thereafter, the levels are maintained until time t12.

The Q output signals (h) and (k) of the D-FFs 118 and 119 are supplied to the D input terminals of the D-FFs 120 and 121, respectively. The D-FFs 120 and 121 receive the clock signal ICLK (a) as the CLK inputs thereto and fetch the D input waveforms at the timing of a rising edge of the waveform of the clock signal ICLK (a). Here, the timing of the rising edge of the clock signal ICLK (a) is time t4, and since the Q output signal (h) of the D-FF 118 has the "H" level and the Q output signal (k) of the D-FF 119 has the "L" level at the timing, the level of the Q output signal (i) of the D-FF 120 becomes the "H" level and the level of the Q output signal (l) of the D-FF 121 becomes the "L" level.

The next rising edge timing of the clock signal ICLK (a) is time t8 and the Q output signal (h) of the D-FF 118 has the "L" level then. Therefore, the level of the Q output signal (i) of the D-FF 120 changes to the "L" level. Meanwhile, since the level of the Q output signal (k) of the D-FF 119 is the "H" level, the level of the Q output signal (l) of the D-FF 121 changes to the "H" level. The levels of the Q output signals (i) and (l) are maintained until time t12.

The Q output signals (i) and (l) of the D-FFs 120 and 121 are inputted to the D input terminals of the D-FFs 122 and 123 in the next stage, respectively. Also the D-FFs 122 and 123 receive the clock signal ICLK (a) as the CLK inputs thereto and fetch the D input waveforms at the timing of a rising edge of the waveform. Here, the rising edge timing of the clock signal ICLK (a) is time t8 and the D-FFs 122 and 123 fetch the levels of the Q output signals (i) and (l) of the D-FFs 120 and 121, respectively. Consequently, the level of the Q output signal (j) of the D-FF 122 changes to the "H" level and the level of the Q output signal (m) of the D-FF 123 changes to the "L" level.

The timing at which the clock signal ICLK (a) rises subsequently is time t12, and the Q output signal (i) of the D-FF 120 has the "L" level and the Q output signal (l) of the D-FF 121 has the "H" level at the timing. Therefore, the level of the Q output signal (j) of the D-FF 122 changes from the "H" level to the "L" level while the level of the Q output signal (m) of the D-FF 123 changes from the "L" level to the "H" level.

The Q output signal (j) of the D-FF 122 is supplied to the input terminal A of the AND gate 124. The Q output signal (l) of the D-FF 121 is supplied to the input terminal B of the AND gate 124. Consequently, the level of the DOWN pulse signal which is the output signal (n) of the AND gate 124 changes to the "L" level because the Q output signal (l) of the D-FF 121 changes to the "L" level at time t4. Then, at time t8, since both of the levels of the Q output signals (l)

and (j) of the D-FFs 121 and 122 change to the "H" level, the level of the DOWN pulse signal changes to the "H" level.

Then at time t12, since the level of the Q output signal (l) of the D-FF 121 does not change and remains at the "H" level, the level of the Q output signal (j) of the D-FF 122 changes from the "H" level to the "L" level. Consequently, the level of the output signal (n) of the AND gate 124, that is, the level of the DOWN pulse signal, changes from the "H" level to the "L" level.

Meanwhile, the Q output signal (m) of the D-FF 123 is supplied to the input terminal B of the AND gate 125. The Q output signal (i) of the D-FF 120 is supplied to the input terminal A of the AND gate 125. Consequently, the UP pulse signal which is the output signal (o) of the AND gate 125 exhibits the "L" level because the levels of the Q output signals (i) and (m) of the D-FFs 120 and 123 change to the "L" level at time t8. Then at time t12, the level of the Q output signal (m) of the D-FF 123 changes to the "H" level. However, since the level of the Q output signal (i) of the D-FF 120 remains at the "L" level, the output signal (o) of the AND gate 125 maintains the "L" level.

From the foregoing, the frequency detection circuit of FIG. 12 generally operates in the following manner. If (ICLK, QCLK)=(0, 1) are sampled at a certain DATA changing point of time and then (ICLK, QCLK)=(1, 1) are sampled at the next DATA changing point of time, then an UP pulse signal of a duration equal to one period of the clock signal ICLK is outputted. In particular, if data of m bits (m is an arbitrary integer) is present between the two DATA changing points of time, then since this signifies that less than m cycles of the clock signal ICLK are present within the period, in order to raise the frequency of the clock signal ICLK, a pulse or pulses of the UP pulse signal are produced.

On the other hand, if (ICLK, QCLK)=(0, 1) are sampled at a certain DATA changing point of time and then (ICLK, QCLK)=(0, 0) are sampled at the next DATA changing point of time, then a DOWN pulse signal of a duration equal to one period of the clock signal ICLK is generated. Thus, if data of m' bits (m' is an arbitrary integer) is present between the two DATA changing points of time, since this signifies that more than m' cycles of the clock signal ICLK are present within the period, in order to lower the frequency of the clock signal ICLK, a pulse or pulses of the DOWN pulse signal are produced.

When the frequencies of the clock signal ICLK and the input signal DATA fully coincide with each other, one of (0, 0), (0, 1), (1, 0) and (1, 1) is successively sampled at each DATA changing point of time, and neither the UP pulse signal nor the DOWN pulse signal is generated.

In this manner, the output signal (n) of the AND gate 124 is supplied as the DOWN pulse signal and the output signal (o) of the AND gate 125 is supplied as the UP pulse signal to the charge pump circuit 104 shown in FIG. 11. Then, the DOWN/UP pulse signal is used to control the charge pump circuit 104 to smooth (rectify) the output current of the charge pump circuit 104 to generate a control voltage for the VCO 106 through the loop filter 105.

The operation of the frequency detection circuit 102 in the foregoing description relates to operation when the duty ratios of the input signal DATA and the clock signals (ICLK and QCLK) are 100% and 50%, respectively. However, particularly in optical communication or the like, the transmission signal DATA suffers from some duty distortion as seen from the waveform (b) or (c) of FIG. 14, potentially giving rise to malfunction of the PLL circuit. FIG. 15 illustrates waveforms of the clock signals ICLK and QCLK and the transmission signal DATA when they suffer from some duty distortion.

As described hereinabove, in the conventional frequency detection circuit, the values of the clock signal ICLK and the clock signal QCLK are sampled at a changing point of time of the input signal DATA. Therefore, if the frequencies of the signals coincide fully with one each other, then the sample value within the period from time t2 to time t3 in FIG. 13 is "0" for the clock signal ICLK and "1" for the clock signal QCLK; the sample value within the period from the next DATA changing point t6 to time t7 is "0" for the clock signal ICLK and "0" for the clock signal QCLK; and if a DATA changing point is present within the period from time t10 to time t11, then the sample value at the point of time is "0" for the clock signal ICLK and "1" for the clock signal QCLK. Thus, it can be seen that the sample values at the three changing points are equal to one another.

However, as can be seen from the timing chart of FIG. 15, which illustrates a timing relationship when the input signal DATA is distorted and has a different duty ratio, whereas the clock signal QCLK is obtained by delaying the phase of the clock signal ICLK by 90 degrees, if the duty ratio of the input signal DATA increases and the width for one bit of the "H" level thereof becomes greater than the period of the clock signal ICLK, then if the input signal DATA rises within the period from time t1 to time t2, then the level of the clock signal ICLK is "1" and the level of the clock signal QCLK is "1" at the rising edge of the input signal DATA.

Then, when the input signal DATA exhibits a falling edge within the period from time t7 to time t8, both of the levels of the clock signal ICLK and the clock signal QCLK exhibit "0", and the sample values of the clock signals ICLK and QCLK at the rising edge and the falling edge of the input signal DATA exhibit a variation from (1, 1) to (0, 0). Consequently, the frequency detection circuit malfunctions apparently.

On the other hand, if the duty ratio of the input signal DATA decreases and the width of one bit of the "H" level thereof becomes smaller than the period of the clock signal ICLK, then both of the levels of the clock signals ICLK and QCLK exhibit "0" at a rising edge of the input signal DATA within the period from time t3 to time t4. However, both of the levels of the clock signals ICLK and QCLK exhibit "1" at a falling edge of the input signal DATA within the period from time t5 to time t6. Consequently, the sample values of the clock signals ICLK and QCLK exhibit a change from (0, 0) to (1, 1).

As a result, the frequency detection circuit malfunctions. In other words, since in the conventional frequency detection circuit the clock signal ICLK and the clock signal QCLK are sampled at both rising and falling changing points of the input signal DATA, that is, in a 1/2 period of the input signal DATA, if the input signal DATA is distorted and the duty ratio varies, then the circuit malfunctions.

SUMMARY OF THE INVENTION

It is an object of the present invention to provide a PLL circuit and an optical communication reception apparatus wherein, even if the duty ratio of an input signal varies, stabilized PLL operation is achieved.

In order to attain the object described above, according to an aspect of the present invention, there is provided a PLL circuit, comprising an oscillator for generating an oscillation frequency signal having a variable oscillation frequency, a phase detection circuit for comparing the phases of the oscillation frequency signal of the oscillator and an input signal with each other and outputting, based on a result of the comparison, a first phase control signal for advancing the phase of the oscillation frequency signal of the oscillator or a second phase control signal for delaying the phase of the oscillation frequency signal of the oscillator, a signal generation circuit for generating first and second signals having different phases from each other based on the oscillation frequency signal of the oscillator, and a frequency detection circuit for fetching the first and second signals generated by the signal generation circuit in synchronism with the input signal for each period of the input signal, logically operating the fetched signals and signals having been fetched in the immediately preceding period and outputting, based on a result of the arithmetic operation, a first frequency control signal for raising the frequency of the oscillation frequency signal of the oscillator or a second frequency control signal for lowering the frequency of the oscillation frequency signal of the oscillator.

According to another aspect of the present invention, there is provided an optical communication reception apparatus, comprising light reception means for receiving an optical signal, converting the optical signal into an electric signal and outputting the electric signal, a PLL circuit for producing a clock signal synchronized with the output signal of the light reception means, and a retiming circuit for retiming the output signal of the light reception means based on the clock signal produced by the PLL circuit, the PLL circuit including an oscillator for generating an oscillation frequency signal having a variable oscillation frequency, a phase detection circuit for comparing the phases of the oscillation frequency signal of the oscillator and an input signal with each other and outputting, based on a result of the comparison, a first phase control signal for advancing the phase of the oscillation frequency signal of the oscillator or a second phase control signal for delaying the phase of the oscillation frequency signal of the oscillator, a signal generation circuit for generating first and second signals having different phases from each other based on the oscillation frequency signal of the oscillator, and a frequency detection circuit for fetching the first and second signals generated by the signal generation circuit in synchronism with the input signal for each period of the input signal, logically operating the fetched signals and signals having been fetched in the immediately preceding period and outputting, based on a result of the arithmetic operation, a first frequency control signal for raising the frequency of the oscillation frequency signal of the oscillator or a second frequency control signal for lowering the frequency of the oscillation frequency signal of the oscillator.

In the PLL circuit and the optical communication reception apparatus, the frequency detection circuit having the configuration described above fetches the first and second signals having different phases from each other for each period of the input signal, that is, only at each rising timing (or falling timing) of the input signal. Therefore, even if the duty ratio of the input signal varies, when the frequencies of the input signal and the first and second signals coincide with each other, the fetched values are always equal to each other. Consequently, even if the duty ratio of the input signal varies, as long as the frequencies of the input signal and the first and second signals coincide with each other, an incorrect first or second frequency control signal is not generated, and a stabilized PLL operation can be achieved.

The above and other objects, features and advantages of the present invention will become apparent from the following description and the appended claims, taken in conjunction with the accompanying drawings in which like parts or elements are denoted by like reference symbols.

BRIEF DESCRIPTION OF THE DRAWINGS

FIG. 14 is a waveform diagram showing waveforms of an input signal to the frequency detection circuit of FIG. 12 when the input signal has some duty distortion and when the input signal has no duty distortion; and FIG. 15 is a timing chart illustrating circuit operation of the frequency detection circuit of FIG. 12 when the input signal has some duty distortion.

DETAILED DESCRIPTION OF THE PREFERRED EMBODIMENT

Figure 1:
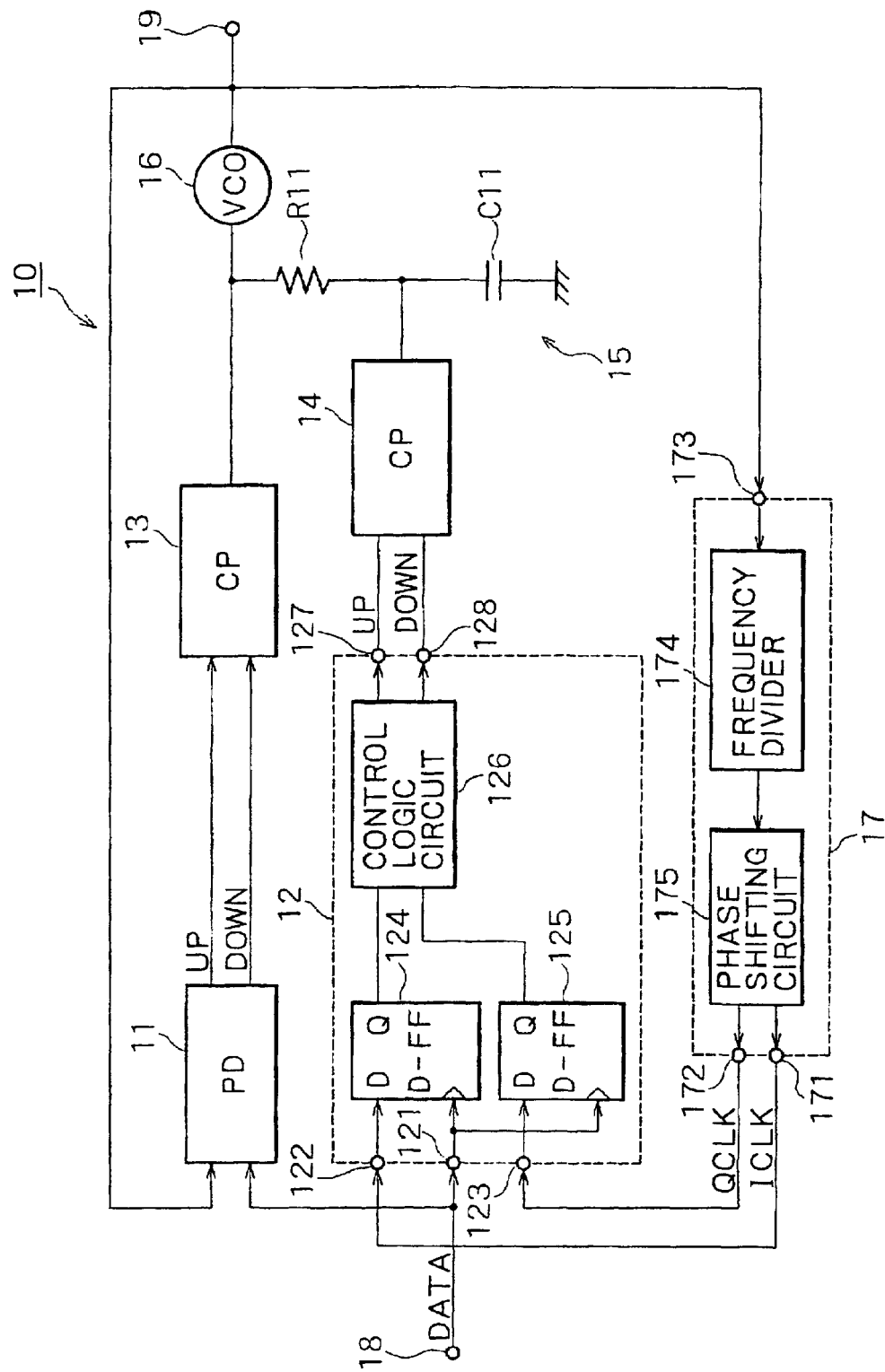
FIG. 1 is a block diagram showing an example of a configuration of a PLL circuit to which the present invention is applied.

Referring to FIG. 1, there is shown an example of a configuration of a PLL circuit to which the present invention is applied. The PLL circuit shown is used, for example, in a reception apparatus for optical communication although it can be applied to various other apparatuses.

The PLL circuit 10 shown includes a phase detection (PD) circuit 11, a frequency detection (FD) circuit 12, a pair of charge pump (CP) circuits 13 and 14, a loop filter 15, a voltage-controlled oscillator (VCO) 16 and a clock generator 17. The PLL circuit 10 has a circuit input terminal 18 to which a serial digital signal DATA is inputted. The digital signal DATA is used in optical communication and may be an NRZ signal (waveform).

The circuit input terminal 18 is connected to one of the input terminals (i.e., a data input terminal) of the phase detection circuit 11 and a data input terminal 121 of the frequency detection circuit 12. The other input terminal of the phase detection circuit 11 is connected to an output terminal the VCO 16. An ICLK input terminal 122 and a QCLK input terminal 123 of the frequency detection circuit 12 are connected to an ICLK output terminal 171 and a QCLK output terminal 172 of the clock generator 17, respectively.

The output terminal of the phase detection circuit 11 is connected to an input terminal of the charge pump circuit 13. The output terminal of the charge pump circuit 13 is connected to a control input terminal of the VCO 16 through the loop filter 15. A pair of output terminals 127 and 128 of the frequency detection circuit 12 are individually connected to corresponding input terminals of the charge pump circuit 14. Also, the output terminal of the charge pump circuit 14 is connected to the control input terminal of the VCO 16 through the loop filter 15.

The loop filter 15 has a low-pass filter configuration and includes, for example, a resistor R11 connected between the output terminals of the charge pump circuits 13 and 14 and a capacitor C11 connected between the output terminal of the charge pump circuit 14 and the ground. The output terminal of the VCO 16 is connected to the other input terminal of the phase comparison circuit 11 as described above and further connected to a circuit output terminal 19 and a clock input terminal 173 of the clock generator 17.

The clock generator 17 includes a frequency divider 174 and a phase shifting circuit 175 and generates, based on an oscillation frequency clock of the VCO 16, first and second signals having phases different from each other, for example, a clock signal ICLK having a phase the same (in phase) as that of the VCO oscillation frequency clock and another clock signal QCLK having a phase shifted, for example, by 90 degrees (a quadrature phase) from that of the clock signal ICLK.

More particularly, the frequency 174 divides the oscillation frequency clock of the VCO 16 to a predetermined dividing ratio (1/n) and supplies the resulting divisional clock to the phase shifting circuit 175. The phase shifting circuit 175 outputs the divisional clock from the frequency divider 174 as the clock signal ICLK from the output terminal 171. Further, the phase shifting circuit 175 shifts the clock signal ICLK, for example, by 90 degrees in phase and outputs the clock signal ICLK of the shifted phase as the clock signal QCLK from the output terminal 172.

In the PLL circuit 10 having the configuration described above, an NRZ digital signal is supplied to one of the input terminals of the phase detection circuit 11 and the data input terminal 121 of the frequency detection circuit 12 through the circuit input terminal 18. Meanwhile, the oscillation frequency clock of the VCO 16 is supplied to the other input terminal of the phase detection circuit 11 while the clock signals ICLK and QCLK generated by the clock generator 17 are supplied to the ICLK input terminal 122 and the QCLK input terminal 123 of the frequency detection circuit 12, respectively.

The frequency detection circuit 12 includes two D-FFs 124 and 125 and a control logic circuit 126. The D-FF 124 is connected at the D input terminal thereof to the ICLK input terminal 122 and at the CLK terminal thereof to the data input terminal 121. The D-FF 125 is connected at the D input terminal thereof to the QCLK input terminal 123 and at the CLK terminal thereof to the data input terminal 121.

Figure 2:
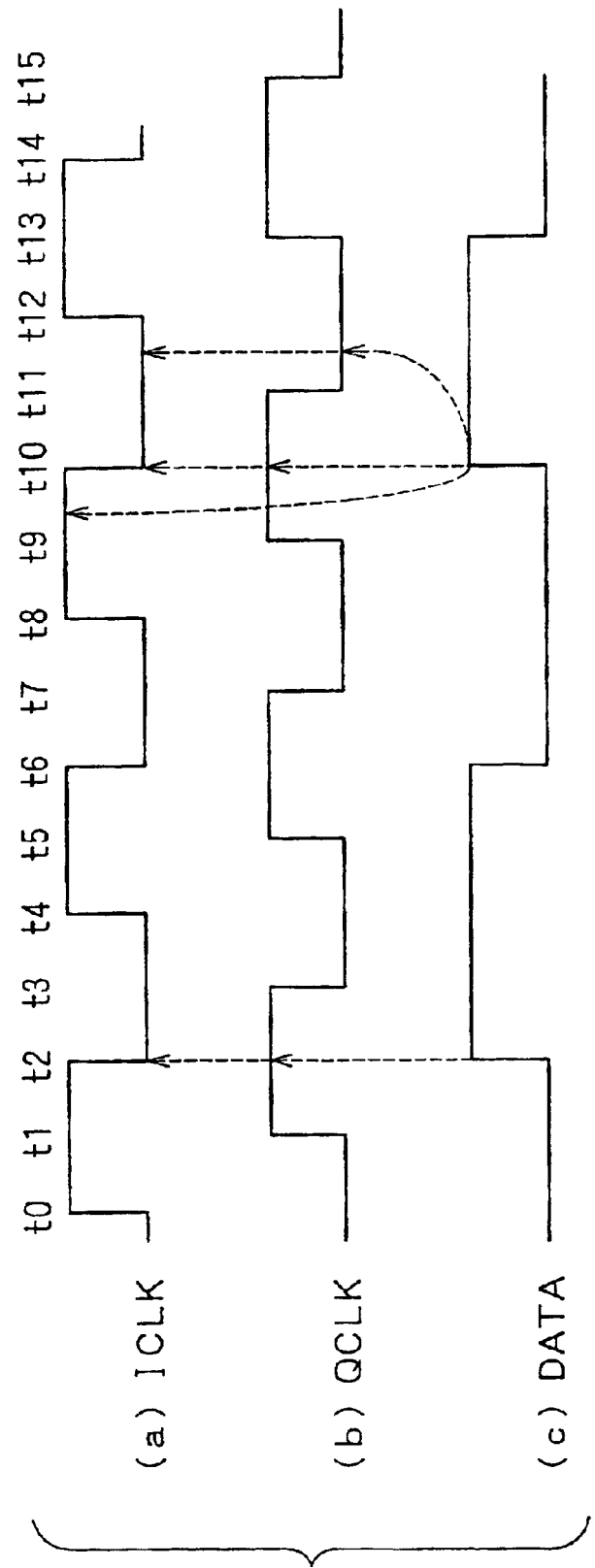
FIG. 2 is a timing chart illustrating circuit operation of a frequency detection circuit shown in FIG. 1.

Circuit operation of the frequency detection circuit 12, which includes the two D-FFs 124 and 125 and the control logic circuit 126, will now be described with reference to the timing chart of FIG. 2.

The timing waveform of the clock signal ICLK supplied to the ICLK input terminal 122 exhibits the "H" level within the period from time t0 to time t2, the "L" level within the period from time t2 to time t4, the "H" level within the period from time t4 to time t6, the "L" level within the period from time t6 to time t8, the "H" level within the period from time t8 to time t10, the "L" level within the period from time t10 to time t12, and the "H" level within the period from time t12 to time t14.

The clock signal QCLK supplied to the QCLK input terminal 123 has a waveform having a phase delayed by 90 degrees from that of the clock signal ICLK and exhibits the "H" level within the period from time t1 to time t3, the "L" level within the period from time t3 to time t5, the "H" level within the period from time t5 to time t7, the "L" level within the period from time t7 to time t9, the "H" level within the period from time t9 to time t11, the "L" level within the period from time t11 to time t13, and the "H" level within the period from time t13 to time t15.

Meanwhile, the waveform of the input signal DATA supplied to the data input terminal 121 has the "L" level from time t0 to time t2, the "H" level from time t2 to time t6, the "L" level from time t6 to time t10, the "H" level from time t10 to time t13, and the "L" level later than time t13.

Here, if it is assumed that the fetching timing of the D input data of each of the D-FFs 124 and 125 is a rising edge of the clock supplied to it, then the D-FFs 124 and 125 fetch the logic levels (ICLK, QCLK)=(0, 1) of the clock signal ICLK and the clock signal QCLK at the timing of time t2 and supply values corresponding to the data as Q output signals to the control logic circuit 126 of the next stage.

The frequency detection circuit 12 has a function of opening a window when particular values (0, 1) are sampled from the data inputted to the D input terminals of the D-FFs 124 and 125 and outputting a comparison result depending upon next sample values.

If the rising timing of the input signal DATA next to time t2 is time t10, then the fetched data values of the D input terminals of the D-FFs 124 and 125 are (0, 1). In this instance, the control logic circuit 126 of the next stage determines that the compared frequencies compared with each other, and outputs nothing.

If the next fetching timing falls between times t9 and t10 after the values (0, 1) are fetched, then the fetched values (samples) of the data now are (1, 1). In this instance, the control logic circuit 126 of the next stage determines that the frequency of the clocks is lower than the frequency of the input signal DATA and outputs an UP pulse signal for raising the frequency. On the other hand, if the values (0, 0) are sampled at the next fetching timings of times t11 and t12 after the values (0, 1) are fetched, then the control logic circuit 126 determines that the frequency of the clock is higher and outputs a DOWN pulse signal for lowering the frequency.

The digital signal (pulse signal) of the UP/DOWN pulse signal obtained by frequency detection by the frequency detection circuit 12 in this manner is supplied to the charge pump circuit 14 of the next stage to turn the transistor of the charge pump circuit 14 on/off, thereby causing electric current to flow out from/into the charge pump circuit 14. The charge pump circuit 14 for controlling the current is formed from, for example, a MOS transistor or a bipolar transistor. The output current of the charge pump circuit 14 is rectified into a dc voltage (dc signal) by the loop filter 15.

The dc voltage is supplied as a control voltage to the VCO 16. The VCO 16 is configured such that, for example, it includes a variable capacitor, and the control voltage is applied to the variable capacitor. The variable capacitor varies its capacitance depending upon the control voltage applied thereto to control the frequency of the oscillation frequency clock of the VCO 16. The oscillation frequency clock is fed back to the frequency detection circuit 12 through the clock generator 17.

The frequency detection circuit 12 compares the frequency of the clock signals ICLK and QCLK thus fed back and the NRZ digital signal DATA with each other. The frequency control operation by frequency comparison described above is repeated to lock the frequency of the oscillation frequency clock of the VCO 16 to a target frequency of the input signal DATA. In this locked state, the output voltage of the loop filter 15 is fixed and does not thereafter vary unless the frequency varies.

After the frequency of the oscillation frequency clock of the VCO 16 is locked to the target frequency of the input signal DATA, operation of the frequency detection circuit 12 remains in a fixed state (in particular, in a state wherein the UP/DOWN signal whose level is the output signal of the frequency detection circuit 12 is fixed to the "L" level). In this instance, if it is assumed that the current with which the capacitor C11 of the charge pump circuit 14 is charged/discharged is sufficiently high when compared with that of the charge pump circuit 13, then the phase detection circuit 11 substantially operates next to the operation of the frequency detection circuit 12.

In particular, the dc voltage based on the detection output of the phase detection circuit 11 is superposed on the dc voltage based on the detection output of the frequency detection circuit 12 by the loop filter 15 to further vary the control voltage to be applied to the VCO 16, thereby controlling the phase of the oscillation frequency clock of the VCO 16.

More particularly, the phase detection circuit 11 detects a delay/lead in phase of the oscillation frequency clock of the VCO 16 with respect to the input signal DATA. The output digital (pulse) signal of the phase detection circuit 11 is supplied in response to the delay/lead in phase to the charge pump circuit 13 of the next stage to control on/off operation of the transistor of the charge pump circuit 13 to cause, for example, electric current to flow out from/into the transistor. The charge pump circuit 13 for controlling the electric current is formed from, for example, a MOS transistor or a bipolar transistor similarly to the charge pump circuit 14 of the frequency detection circuit 12 side.

The output current of the charge pump circuit 13 is rectified into a dc voltage by the loop filter 15. The dc voltage is superposed on the dc voltage of the frequency detection circuit 12 side by the loop filter 15 and supplied as a control voltage to the VCO 16 so that it is applied to the variable capacitor mentioned hereinabove. The variable capacitor changes its capacitance in response to the control voltage applied thereto to control the phase of the oscillation frequency clock of the VCO 16.

The oscillation frequency clock of the VCO 16 having the controlled phase is fed back to the phase detection circuit 11 through the clock generator 17. The phase detection circuit 11 compares the phases of the fed back oscillation frequency clock of the VCO and the NRZ digital signal DATA with each other. Then, the operations of phase detection and phase control described above are repeated until the phase of the oscillation frequency clock of the VCO 16 also coincides with the phase of the input signal DATA.

It is to be noted that although the PLL circuit 10 described above uses the charge pump circuits 13 and 14 of a single output configuration and the VCO 16 having a single input configuration and further uses the loop filter 15, which includes the resistor R11 connected between the output terminals of the charge pump circuits 13 and 14 and the capacitor C11 connected between the output terminal of the charge pump circuit 14 and the ground, the PLL circuit is not necessarily limited to the specific PLL circuit having the configuration described.

Figure 3:
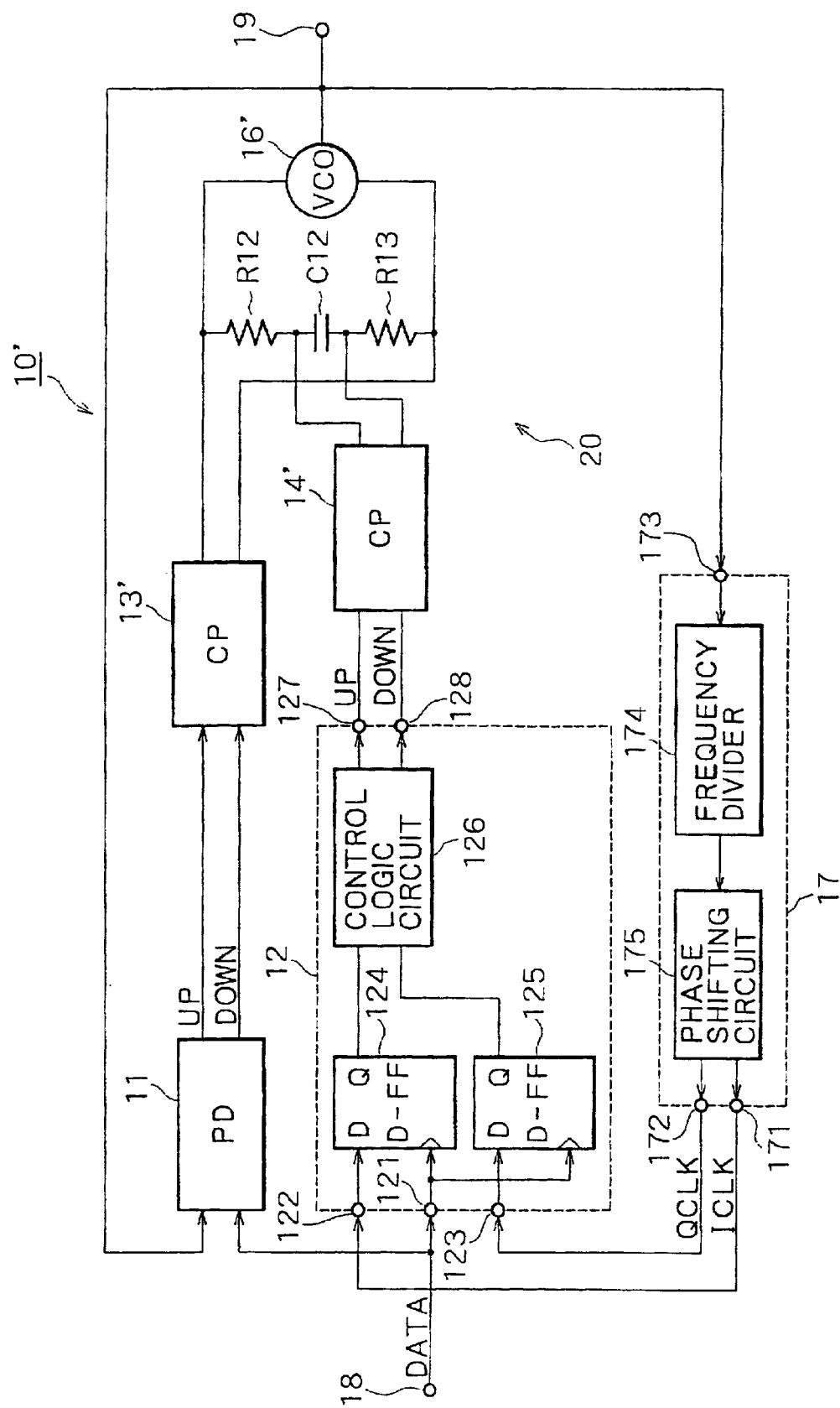
FIG. 3 is a block diagram showing a modification to the PLL circuit of FIG. 1.

In particular, the PLL circuit may be configured such as, for example, PLL circuit 10' shown in FIG. 3, which uses charge pump circuits 13' and 14' of a differential output configuration and a VCO 16' of a differential input configuration, and further employs a loop filter 20 that includes a resistor R12 connected between output terminals of the charge pump circuits 13' and 14', a capacitor C12 connected between the differential output terminals of the charge pump circuit 14' and another resistor R13 connected between the other output terminals of the charge pump circuit 14' and 13'.

Figure 4:
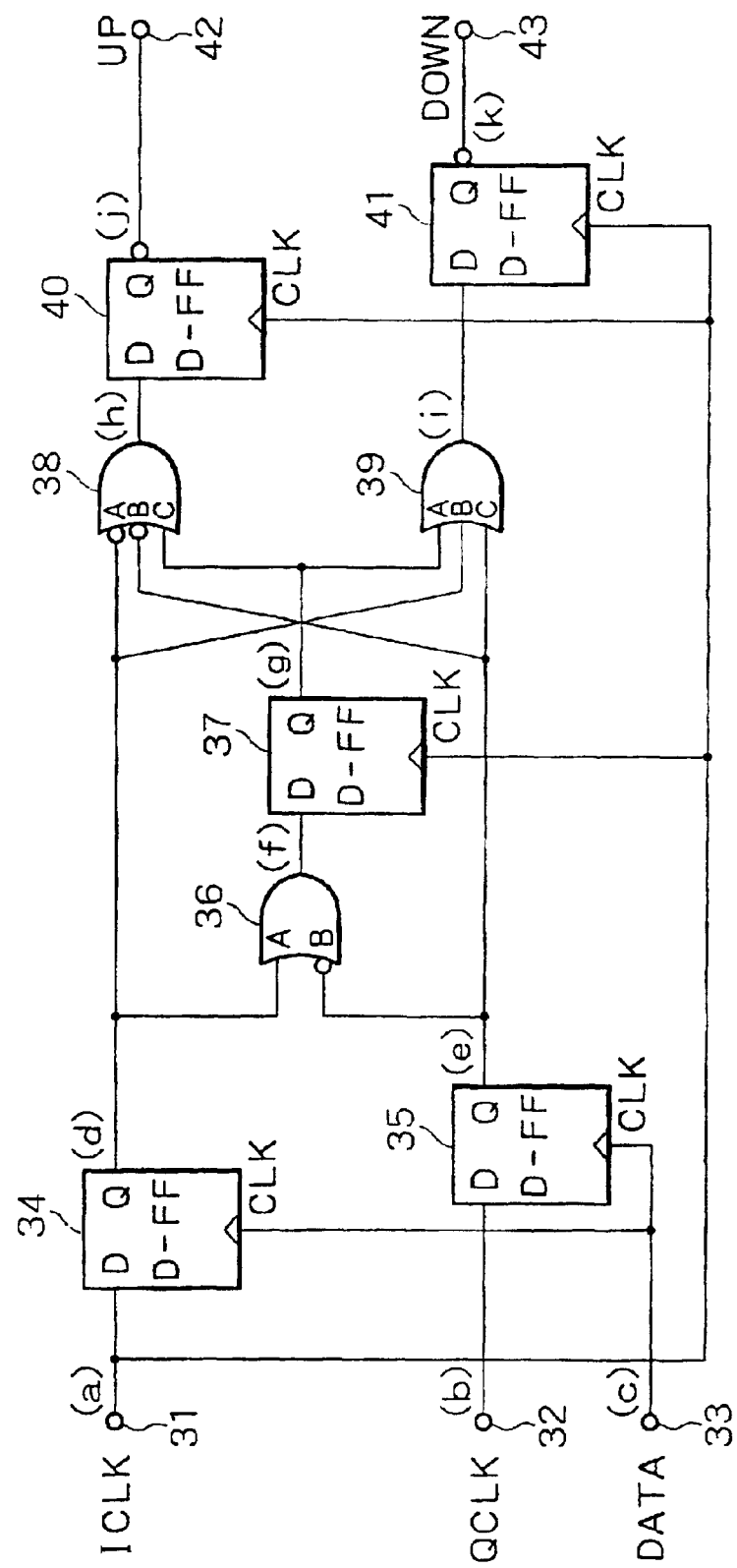
FIG. 4 is a block diagram showing a detailed circuit configuration of the frequency detection circuit shown in FIGS. 1 and 3.

FIG. 4 shows an example of a detailed circuit configuration of the frequency detection circuit 12 used in the PLL circuit 10 (10') to which the present invention is applied, and in particular shows an example of an internal configuration of the control logic circuit 126 of the frequency detection circuit 12 described hereinabove.

Referring to FIG. 4, the clock signal ICLK is supplied to an ICLK input terminal 31, and the clock signal QCLK is supplied to a QCLK input terminal 32. Meanwhile, an NRZ digital signal DATA is supplied to a data input terminal 33. The ICLK input terminal 31, QCLK input terminal 32 and data input terminal 33 correspond to the ICLK input terminal 122, QCLK input terminal 123 and data input terminal 121 of FIG. 1, respectively.

The ICLK input terminal 31 is connected to the D input terminal of a D-FF 34, and the QCLK input terminal 32 is connected to the D input terminal of another D-FF 35. The data input terminal 33 is connected to the CLK terminals of the D-FFs 34 and 35. The D-FFs 34 and 35 correspond to the D-FFs 124 and 125 of FIG. 1, respectively.

Each of the D-FFs 34 and 35 is configured such that it fetches data at input D at a rising edge of a clock CLK. In particular, the D-FF 34 has a function of sampling the clock signal ICLK at a rising edge of the input signal DATA, and the D-FF 35 has a function of sampling the clock signal QCLK at a rising edge of the input signal DATA.

The Q output terminal of the D-FF 34 is connected to an input terminal A of a 2-input OR gate 36 and connected also to a negated input terminal A of a 3-input OR gate 38 and further to an input terminal B of a 3-input OR gate 39. The Q output terminal of the D-FF 35 is connected to a negated input terminal B of the OR gate 36, to a negated input terminal B of the OR gate 38 and to an input terminal C of the OR gate 39.

The output terminal of the OR gate 36 is connected to the D input terminal of a D-FF 37. The CLK input terminal of the D-FF 37 is connected to the ICLK input terminal 31. The Q output terminal of the D-FF 37 is connected to an input terminal C of the OR gate 38 and also to an input terminal A of the OR gate 39.

The output terminals of the OR gates 38 and 39 are connected to the D input terminals of D-FFs 40 and 41, respectively. The CLK input terminals of the D-FFs 40 and 41 are connected to the ICLK input terminal 31. The Q output terminals of the D-FFs 40 and 41 are connected to circuit output terminals 42 and 43, respectively. It is to be noted that the Q output terminals of the D-FFs 40 and 41 are formed as negated output terminals.

The OR gate 36, D-FF 37, OR gates 38 and 39 and D-FFs 40 and 41 described above cooperatively form the control logic circuit 126 of FIG. 1. It is to be noted that the circuit configuration of FIG. 4 is a mere example, and the control logic circuit 126 may be formed according to other circuit configurations.

Figure 5:
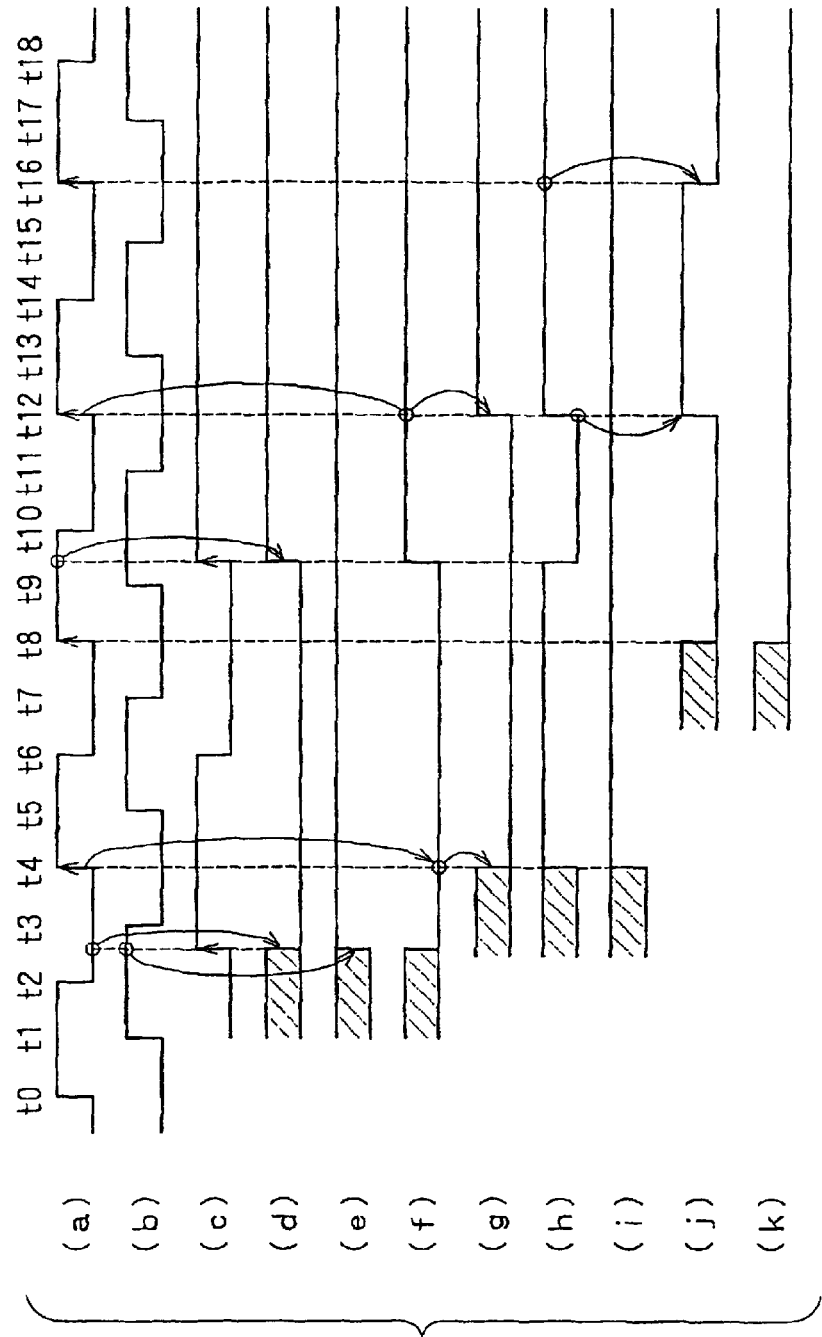
FIG. 5 is a timing chart illustrating circuit operation of the frequency detection circuit of FIG. 4 when it outputs an UP pulse signal.
Figure 6:
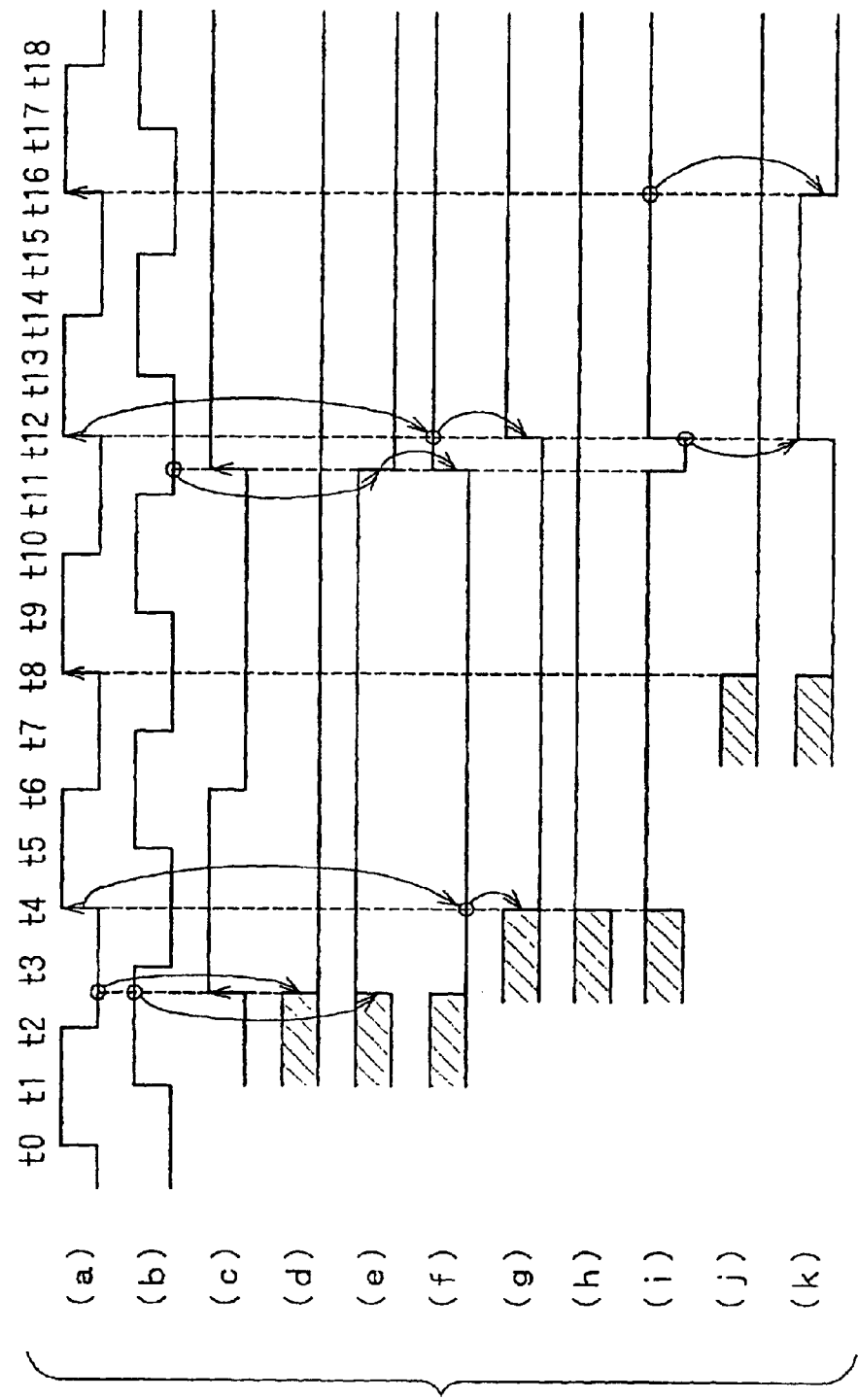
FIG. 6 is a timing chart illustrating circuit operation of the frequency detection circuit of FIG. 4 when it outputs a DOWN pulse signal.

Now, circuit operation of the frequency detection circuit having the configuration described above is described with reference to timing charts of FIGS. 5 and 6. FIG. 5 illustrates a timing chart when the UP pulse signal is outputted, and FIG. 6 illustrates a timing chart when the DOWN pulse signal is outputted. In FIGS. 5 and 6, waveforms (a) to (k) indicate waveforms at nodes (a) to (k) of FIG. 4, respectively.

First, circuit operation when the UP pulse signal is outputted is described with reference to the timing chart of FIG. 5. It is assumed that the waveform of the input signal DATA (c) exhibits a change from the "L" level to the "H" level within the period between times t2 and t3, another change from the "H" level to the "L" in the proximity of time t6, and a further change from the "L" level to the "H" level within the period between times t9 and t10, and maintains the "H" level after time t10.

The D-FFs 34 and 35 fetch the clock signals ICLK (a) and QCLK (b) at a rising edge of the waveform of the input signal DATA (c). Within the period from time t2 to time t3, the clock signal ICLK (a) has the "L" level and the clock signal QCLK (b) has the "H" level, and the D-FFs 34 and 35 fetch the "L" and "H" levels, respectively. Consequently, the level of the Q output signal (d) of the D-FF 34 changes to the "L" level and the level of the Q output signal (e) of the D-FF 35 changes to the "H" level.

The next rising edge of the waveform of the input signal DATA (c) supplied to the CLK terminals of the D-FFs 34 and 35 is included in the period between times t9 and t10, and the levels of the clock signal ICLK (a) and the clock signal QCLK (b) at the point of time are the "H" level. Accordingly, the level of the Q output signal (d) of the D-FF 34 changes from the "L" level to the "H" level within the period between the times t9 and t10.

In this instance, since the level of the clock signal QCLK (b) is the "H" level, the Q output signal (e) of the D-FF 35 does not change but remains at the "H" level. Thereafter, the waveform of the input signal DATA (c) does not exhibit a change until time t16 and the waveform does not include a rising edge. Therefore, the Q output signals (d) and (e) of the D-FFs 34 and 35 do not change but maintain the same levels.

At the point of time at which the input signal DATA (c) changes within the period between times t2 and t3, the "L" level of the Q output signal (d) of the D-FF 34 is supplied to the input terminal A of the OR gate 36, while the "H" level of the Q output signal (e) of the D-FF 35 is supplied to the negated input terminal B of the OR gate 36, and therefore, the level of the output signal (f) of the OR gate 36 changes to the "L" level. Further, the next change from the "L" level to the "H" level of the input signal DATA (c) appears within the period between times t9 and t10.

At the changing timing from the "L" level to the "H" level, the Q output signal (d) of the D-FF 34 changes from the "L" level to the "H" level, while the level of the Q output signal (e) of the D-FF 35 remains at the "H" level. Therefore, the level of the output signal (f) of the OR gate 36 changes from the "L" level to the "H" level. Thereafter, since the waveform of the input signal DATA (c) does not have a change until time t16, the output signal (f) of the OR gate 36 maintains the "H" level.

The output signal (f) of the OR gate 36 is supplied to the D input terminal of the D-FF 37. The clock signal ICLK (a), which differs from the clock signal supplied to the D-FFs 34 and 35, is supplied as the CLK input to the D-FF 37. Consequently, the D-FF 37 fetches the output signal (f) of the OR gate 36, which is the D input thereto, at a rising edge of the clock signal ICLK (a).

In particular, the D-FF 37 fetches the output signal (f) of the OR gate 36 at the rising timing t4 of the clock signal ICLK (a), and thereupon, the level of the output signal (g) thereof changes to the "L" level. Then, at the next rising timing t8 of the clock signal ICLK (a), since the output signal (f) of the OR gate 36 has the "L" level, the output signal (g) of the D-FF 37 does not change but maintains the "L" level.

Further, at the rising edge of the clock signal ICLK (a) at time t12, since the output signal (f) of the OR gate 36 has the "H" level, the level of the Q output signal (g) of the D-FF 37 changes from the "L" level to the "H" level. Also, at time t16, since the output signal (f) of the OR gate 36 has the "H" level, the Q output signal (g) of the D-FF 37 also has the "H" level, and consequently, after time t16, the Q output signal (g) also keeps the state of the "H" level.

The 3-input OR gate 38 receives, at the negated input terminal A thereof, the Q output signal (d) of the D-FF 34, at the negated input terminal B thereof, the Q output signal (e) of the D-FF 35, and at the input terminal C thereof, the Q output signal (g) of the D-FF 37.

The inverted signal of the Q output signal (d) of the D-FF 34 exhibits the "H" level after a DATA rising edge between times t2 and t3 until another DATA rising edge between times t9 and t10 and exhibits the "L" level after the timing of the DATA rising edge, and the inverted signal of the Q output signal (e) of the D-FF 35 exhibits the "L" level after time t4 until time t12 and exhibits the "H" level after time t12. Accordingly, the output signal (h) of the OR gate 38 exhibits the "H" level after time t4 until the DATA rising edge between times t9 and t10 and exhibits the "L" level after the point of time of the DATA rising edge until time t12, and then exhibits the "H" level after time t12.

On the other hand, the 3-input OR gate 39 receives the Q output signal (g) of the D-FF 37 at its input terminal A, the Q output signal (d) of the D-FF 34 at its input terminal B, and the Q output signal (e) of the D-FF 35 at its input terminal C.

The Q output signal (d) of the D-FF 34 exhibits the "L" level after the DATA rising edge between times t2 and t3 until the DATA rising edge between times t9 and t10 and exhibits the "H" level after the timing of the DATA rising edge. The Q output signal (e) of the D-FF 35 exhibits the "H" level after the DATA rising edge between times t2 and t3. Further, the Q output signal (g) of the D-FF 37 exhibits the "L" level after time t4 until time t12 and exhibits the "H" level after time t12. Accordingly, the output signal (i) of the OR gate 39 maintains the "H" level after time t4.

The output signal (h) of the OR gate 38 is supplied to the D input terminal of the D-FF 40. The D-FF 40 fetches the output signal (h) of the OR gate 38, which is input into input D input, in synchronism with the clock signal ICLK (a). In particular, the D-FF 40 fetches the "H" level of the output signal (h) at the rising edge of the clock signal ICLK (a) at time t8.

Consequently, the level of the inverted Q output signal (j) of the D-FF 40 changes to the "L" level. The next rising edge of the clock signal ICLK (a) appears at time t12. Since the output signal (h) of the OR gate 38 at time t12 has the "L"

level, the level of the inverted Q output signal (j) of the D-FF 40 changes to the "H" level. Further, since the next rising edge of the clock signal ICLK (a) appears at time t16 and the output signal (h) of the OR gate 38 then has the "H" level, the level of the inverted Q output signal (j) of the D-FF 40 changes from the "H" level to the "L" level. The inverted Q output signal (j) of the D-FF 40 is used as the UP pulse signal and supplied from the circuit output terminal 42 to the charge pump circuit (charge pump circuit 14 in FIG. 1) of the next stage.

Meanwhile, the output signal (i) of the OR gate 39 is supplied to the D input terminal of the D-FF 41. Since the clock signal ICLK (a) is supplied also as the D input to the D-FF 41, the D-FF 41 fetches the D input data at the same fetching timing as that of the D-FF 40. In particular, since the output signal (i) of the OR gate 39 has the "H" level at time t8, the inverted Q output signal (k) of the D-FF 41 has the "L" level.

Also, at the next rising timings t12 and t16 of the clock signal ICLK (a), since the output signal (i) of the OR gate 39 has the "H" level, the inverted Q output signal (k) of the D-FF 41 similarly continues to output the "L" level. The inverted Q output signal (k) of the D-FF 41 is used as the DOWN pulse signal and supplied from the circuit output terminal 43 to the charge pump circuit (charge pump circuit 14 of FIG. 1) of the next stage.

Now, circuit operation when the DOWN pulse signal is outputted is described with reference to a timing chart of FIG. 6. Now, it is assumed that the waveform of the input signal DATA exhibits a change from the "L" level to the "H" level within the period between times t2 and t3, another change from the "H" level to the "L" level in the proximity of time t6, and a further change from the "L" level to the "H" level within the period between times t11 and t12, and maintains the "H" level after time t12.

The D-FFs 34 and 35 fetch D input data, that is, the clock signals ICLK (a) and QCLK (b), at a rising edge of the waveform of the input signal DATA (c). Within the period from time t2 to time t3, the clock signal ICLK (a) has the "L" level and the clock signal QCLK (b) has the "H" level, and the D-FFs 34 and 35 fetch the "L" and "H" levels, respectively. Consequently, the level of the Q output signal (d) of the D-FF 34 changes to the "L" level and the level of the Q output signal (e) of the D-FF 35 changes to the "H" level.

The next rising edge of the waveform of the input signal DATA (c) supplied to the CLK terminals of the D-FFs 34 and 35 is included in the period between times t11 and t12, and the levels of the clock signal ICLK (a) and the clock signal QCLK (b) at the point of time are the "L" level. Accordingly, the level of the Q output signal (d) of the D-FF 34 maintains the "L" level.

Meanwhile, since the level of the clock signal QCLK (b) is also the "L" level, the level of the Q output signal (e) of the D-FF 35 changes from the "H" level to the "L" level. Thereafter, the waveform of the input signal DATA (c) does not exhibit a change and the waveform thereof does not include a rising edge. Therefore, the Q output signals (d) and (e) of the D-FFs 34 and 35 do not change but maintain the same levels.

At the point of time at which the input signal DATA (c) changes within the period between times t2 and t3, the "L" level of the Q output signal (d) of the D-FF 34 is supplied to the input terminal A of the OR gate 36 while the "L" level of the Q output signal (e) of the D-FF 35 is supplied to the negated input terminal B of the OR gate 36, and therefore, the level of the output signal (f) of the OR gate 36 changes to the "L" level. Further, the next variation from the "L" level to the "H" level of the input signal DATA (c) at the next changing point appears within the period between times t11 and t12.

At the variation timing from the "L" level to the "H" level, the Q output signal (d) of the D-FF 34 remains at the "L" level while the level of the Q output signal (e) of the D-FF 35 changes from the "H" level to the "L" level. Therefore, the level of the output signal (f) of the OR gate 36 changes from the "L" level to the "H" level. Thereafter, since the waveform of the input signal DATA (c) does not change, the output signal (f) of the OR gate 36 maintains the "H" level.

The output signal (f) of the OR gate 36 is supplied to the D input terminal of the D-FF 37. The clock signal ICLK (a), which differs from the input signal DATA supplied to the CLK input terminals of the D-FFs 34 and 35 is supplied as the CLK input to the D-FF 37. Consequently, the D-FF 37 fetches the output signal (f) of the OR gate 36 at its D input at a rising edge of the clock signal ICLK (a).

In particular, the D-FF 37 fetches the output signal (f) of the OR gate 36 at the rising timing t4 of the clock signal ICLK (a), and thereupon, the level of the output signal (g) thereof changes to the "L" level. Then, at the next rising timing t8 of the clock signal ICLK (a), since the output signal (f) of the OR gate 36 has the "L" level, the Q output signal (g) of the D-FF 37 does not change but maintains the "L" level.

Further, at the rising edge of the clock signal ICLK (a) at time t12, since the output signal (f) of the OR gate 36 has the "H" level, the level of the Q output signal (g) of the D-FF 37 changes from the "L" level to the "H" level. Also, at time t16, since the output signal (f) of the OR gate 36 has the "H" level similarly, the Q output signal (g) of the D-FF 37 also has the "H" level, and consequently, also after time t16, the Q output signal (g) keeps the state of the "H" level.

The 3-input OR gate 38 receives the Q output signal (d) of the D-FF 34 at its negated input terminal A, the Q output signal (e) of the D-FF 35 at its negated input terminal B, and the Q output signal (g) of the D-FF 37 at its input terminal C.

The inverted signal of the Q output signal (d) of the D-FF 34 exhibits the "H" level after a DATA rising edge between times t2 and t3 until time t8, and the inverted signal of the Q output signal (e) of the D-FF 35 exhibits the "L" level after the DATA rising edge between times t2 and t3 until a time between times t11 and t12 and exhibits the "H" level after the time between times t11 and t12. Further, the Q output signal (g) of the D-FF 37 has the "L" level from time t4 to time t12 and exhibits the "H" level after time t12. Accordingly, the output signal (h) of the OR gate 38 exhibits the "H" level after time t4.

On the other hand, the 3-input OR gate 39 receives, the Q output signal (g) of the D-FF 37 at its input terminal A, the Q output signal (d) of the D-FF 34 at its input terminal B, and the Q output signal (e) of the D-FF 35 at its input terminal C.

The Q output signal (d) of the D-FF 34 exhibits the "L" level after the DATA rising edge between times t2 and t3. The Q output signal (e) of the D-FF 35 exhibits the "H" level after the DATA rising edge between times t2 and t3 until the DATA rising edge of the waveform of the input signal DATA between times t11 and t12 and exhibits the "L" level after the timing of the rising edge. Further, the Q output signal (g) of the D-FF 37 exhibits the "L" level after time t4 until time t12 and exhibits the "H" level after time t12. Accordingly, the output signal (i) of the OR gate 39 exhibits the "H" level after time t4 until the rising edge of the input signal DATA between times t11 and t12, and exhibits the "L" level after the DATA rising edge until time t12. Further, the output signal (i) of the OR gate 39 maintains the "H" level within the period after time t12.

The output signal (h) of the OR gate 38 is supplied to the D input terminal of the D-FF 40. The D-FF 40 fetches the output signal (h) of the OR gate 38, which is D input data thereto, in synchronism with the clock signal ICLK (a). In particular, the D-FF 40 fetches the "H" level of the output signal (h) of the OR gate 38 at the rising edge of the clock signal ICLK (a) at time t8.

Consequently, the level of the inverted Q output signal (j) of the D-FF 40 changes to the "L" level. The next rising edge of the clock signal ICLK (a) appears at time t12 and at time t16. Since the output signal (h) of the OR gate 38 at time t12 and time t16 has the "H" level, the inverted Q output signal (j) of the D-FF 40 continues to have the "L" level.

Meanwhile, the output signal (i) of the OR gate 39 is supplied to the D input terminal of the D-FF 41. Since the clock signal ICLK (a) is supplied also as the D input to the D-FF 41, the D-FF 41 fetches the D input data at the same fetching timing as that of the D-FF 40. In particular, since the output signal (i) of the OR gate 39 has the "H" level at time t8, the inverted Q output signal (k) of the D-FF 41 has the "L" level.

Further, at the timing t12 of the next rising edge of the clock signal ICLK (a), since the output signal (i) of the OR gate 39 has the "L" level, the level of the inverted Q output signal (k) of the D-FF 41 changes to the "H" level. Further, since the output signal (i) of the OR gate 39 at time 16 has the "H" level, the level of the inverted Q output signal (k) of the D-FF 41 changes from the "HH" level to the "L" level. The inverted Q output signal (k) of the D-FF 41 is used as the DOWN pulse signal and supplied from the circuit output terminal 43 to the charge pump circuit (charge pump circuit 14 of FIG. 1) of the next stage.

In this manner, whereas the UP pulse signal (j) which is the inverted Q output signal of the D-FF 40, continues to keep the "L" level within the period from time t8 to time 18, the DOWN pulse signal (k), which is the inverted Q output signal of the D-FF 41, maintains the "H" level within the period from time t12 to time 16 to control the electric current to the charge pump circuit 14 of the next stage to generate the control voltage to the VCO 16.

In summary, the frequency detection circuit of FIG. 4 operates in the following manner. If (ICLK, QCLK)=(1, 1) are sampled at the point of time of a DATA rising edge next to the point of time of a certain DATA rising edge at which (0, 1) are sampled, then an UP pulse signal having a duration equal to one period of the clock signal ICLK is outputted. Thus, if data of m (m is an arbitrary integer) bits is present between the points of time of the two DATA rising edges, then since this signifies that the clock signal ICLK has less than m cycles within the period, a pulse of the UP pulse signal is generated in order to raise the frequency of the clock signal ICLK.

On the other hand, if (ICLK, QCLK)=(0, 0) are sampled at the point of time of a DATA rising edge next to the point of time of a certain DATA rising edge at which (0, 1) are sampled, then a DOWN pulse signal having a duration equal to one period of the clock signal ICLK is outputted. Thus, if data of m' (m' is an arbitrary integer) bits is present between the points of time of the two DATA rising edges, then since this signifies that the clock signal ICLK has more than m' cycles within the period, a pulse of the DOWN pulse signal is generated in order to lower the frequency of the clock signal ICLK.

When the input signal DATA has no duty distortion, if the frequencies of the clock signal ICLK and the input signal DATA fully coincide with each other, then (0, 0), (0, 1), (1, 0) or (1, 1) is successively sampled at the point of time of each rising edge of the input signal DATA, and neither the UP pulse signal nor the DOWN pulse signal is generated.

Figure 7:
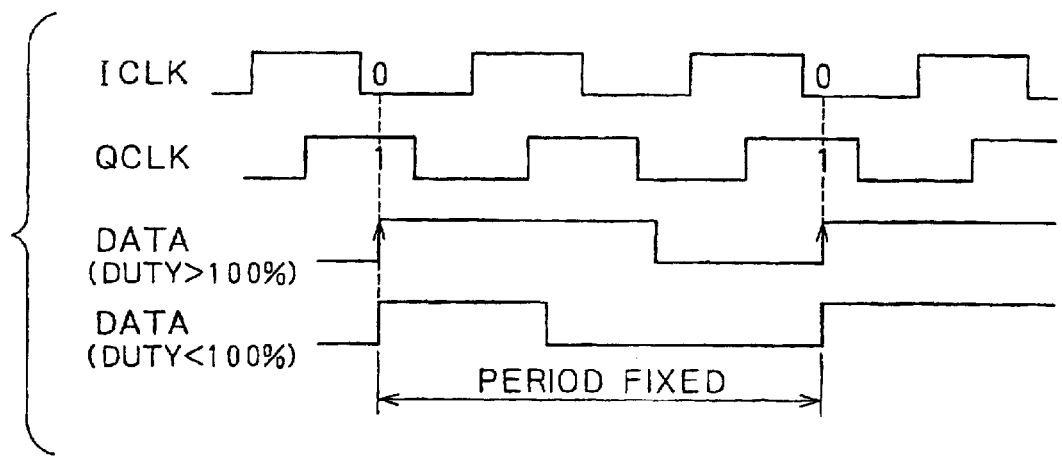
FIG. 7 is a timing chart illustrating circuit operation of the frequency detection circuit shown in FIGS. 1 and 3 when an input signal has some duty distortion.

Even when the input signal DATA has some duty distortion, if the frequencies of the clock signal ICLK and the input signal DATA fully coincide with each other, then since the clock signals ICLK and QCLK are sampled only at each rising edge of the input signal DATA as seen from a timing chart of FIG. 7, the combination of sample values of them is fixed.

Where the frequency detection circuit in the present embodiment is used as the frequency detection circuit 14 (14') of the PLL circuit 10 (10') as described above, if the clock signal ICLK and the QCLK are sampled only at a rising edge (timing) of the NRZ serial input signal DATA, then even if the duty ratio of the input signal DATA varies, when the frequencies of the data and the clocks coincide with each other, the sample values are always equal to each other. Consequently, generation of an incorrect UP pulse signal or DOWN pulse signal is eliminated, and a stabilized PLL operation can be achieved.

It is to be noted that, although the frequency detection circuit 12 described above samples the "L" level (logic "0") of the clock signal ICLK and the "H" level (logic "1") of the clock signal QCLK at a rising edge of the serial input signal DATA, any combination of logic values may be used. However, where the combination of logic values described above in connection with the frequency detection circuit 12 is adopted, as can be seen apparently from the timing chart of FIG. 7, the combination of logic values is positioned substantially at the center of one period of the input signal DATA. Consequently, since control upon phase adjustment after the frequency adjustment can be performed in the proximity of the center of one period of the input signal DATA, there is an advantage that a wide control range can be used for the phase control.

Further, although frequency detection circuit 12 described above only samples the clock signal ICLK and the clock signal QCLK at a rising edge of the input signal DATA, it is otherwise possible to sample the clock signal ICLK and the clock signal QCLK at a falling edge of the input signal DATA. Also in this instance, an incorrect UP pulse signal or DOWN pulse signal is not generated at all, and a stabilized PLL operation can be achieved.

Figure 8:
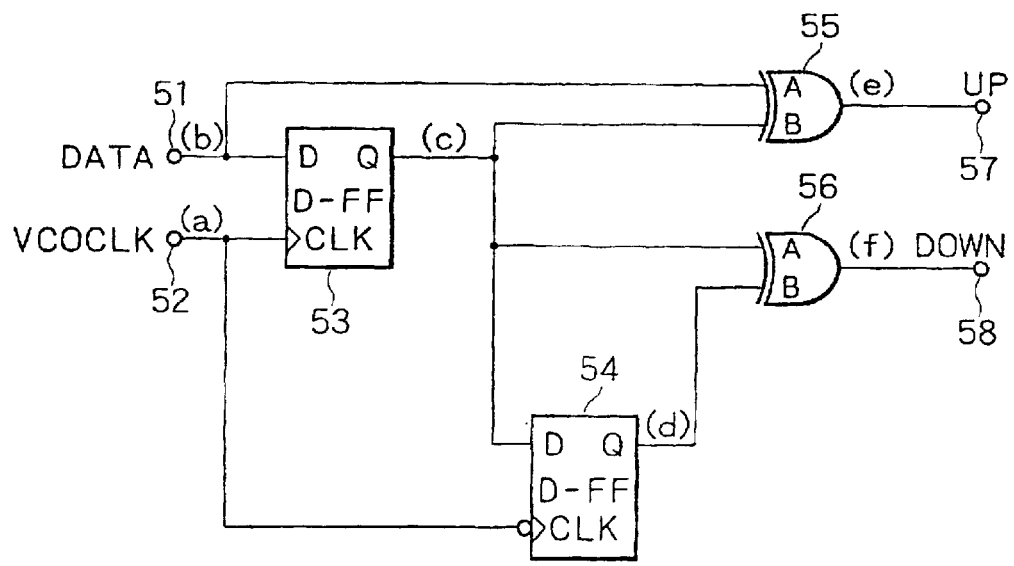
FIG. 8 is a block diagram showing a detailed circuit configuration of a phase detection circuit shown in FIGS. 1 and 3.

The phase detection circuit 11 used in the PLL circuit 10 (10') will now be described. An example of a circuit configuration of the phase detection circuit 11 is shown in FIG. 8. First, the circuit configuration of the phase detection circuit 11 is described.

Referring to FIG. 8, a data input terminal 51 to which the input signal DATA is supplied is connected to the D input terminal of a D-FF 53 and also to an input terminal A of a 2-input exclusive OR (EX-OR) gate 55. Meanwhile, a CLK input terminal 52 to which the oscillation frequency clock of the VCO 16 is supplied is connected to the CLK terminal of the D-FF 53 and also to the negated CLK terminal of a D-FF 54.

The Q output terminal of the D-FF 53 is connected to the other input terminal B of the EX-OR gate 55, an input terminal A of a 2-input EX-OR gate 56 and the D input terminal of the D-FF 54. The Q output terminal of the D-FF 54 is connected to the other input terminal B of the EX-OR gate 56. The output terminal of the EX-OR gate 55 is connected to an UP output terminal 57 while the output terminal of the EX-OR gate 56 is connected to a DOWN output terminal 58.

Figure 9:
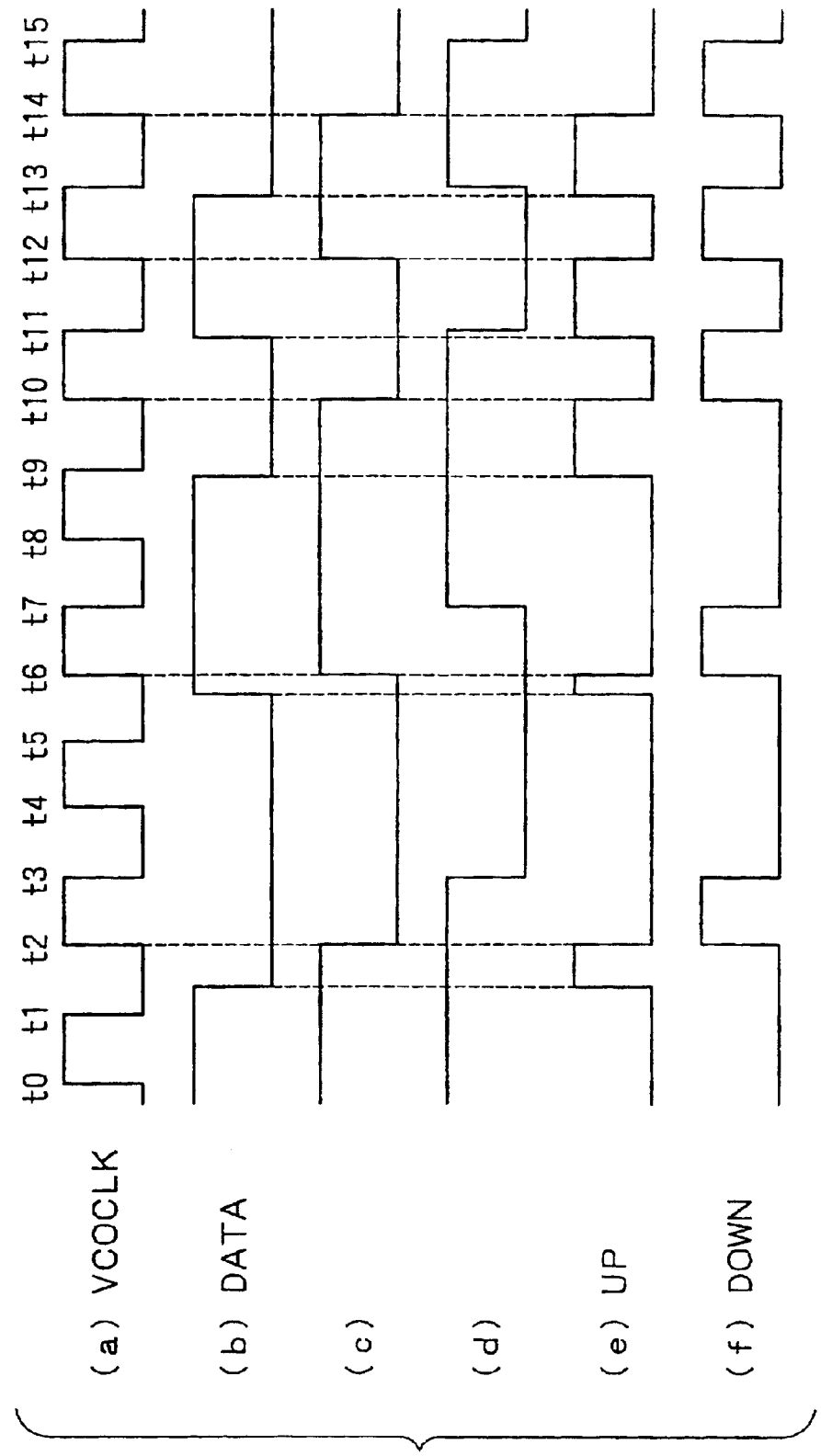
FIG. 9 is a timing chart illustrating circuit operation of the phase detection circuit shown in FIG. 8.

The circuit operation of the phase detection circuit 11 having the configuration described above will now be described with reference to the timing chart of FIG. 9. In the timing chart of FIG. 9, waveforms (a) to (f) indicate waveforms at nodes (a) to (f) of FIG. 8, respectively.

It is assumed that the oscillation frequency clock VCO-CLK (a) of the VCO 16 inputted to the CLK input terminal 52 rises at times to, t2, t4, t6, t8, t10, t12 and t14 and falls at times t1, t3, t5, t7, t9, t11, t13 and t15.

Also, it is assumed that the waveform of the input signal DATA (b) falls within the period between times t1 and t2 and thereafter maintains the "L" level until it rises within the period between times t5 and t6; maintains the "H" level until it falls within the period between times t8 and t9; maintains the "L" level until it rises within the period between times t10 and t11; maintains the "H" level until it falls within the period between times t12 and t13; and thereafter maintains the "L" level until time t15.

The D-FF 53 fetches the "L" level of the input signal DATA (b) at the rising timing t2 of the clock VCOCLK (a). Consequently, the level of the Q output signal (c) of the D-FF 53 changes to the "L" level. At the next rising timing t4 of the clock VCOCLK (a), since the input signal DATA does not change but maintains the "L" level, also the Q output signal (c) of the D-FF 53 also does not change but maintains the "L" level.

At the next rising timing t6 of the clock VCOCLK (a), since the input signal DATA has the "H" level, the level of the Q output signal (c) of the D-FF 53 changes to the "H" level. Further, at the rising timing of the clock VCOCLK (a) at time t8, since the input signal DATA has the "H" level and the D-FF 53 fetches the "H" level, the level of the Q output signal (c) of the D-FF 53 does not change but remains at the "H" level.

Then at time t10, since the level of the input signal DATA has changed to the "L" level, the Q output signal (c) of the D-FF 53 also changes from the "H" level to the "L" level. At time t12, since the input signal DATA has the "H" level, the level of the Q output signal (c) of the D-FF 53 changes to the "H" level, and then at the next rising timing t14 of the clock VCOCLK (a), the input signal DATA has the "L" level. Consequently, the D-FF 53 fetches the "L" level of the input signal DATA, and the Q output signal (c) thereof changes to the "L" level.

Meanwhile, an inverted clock of the clock VCOCLK (a) is supplied as the CLK input to the D-FF 54. Accordingly, the D-FF 54 fetches the input signal DATA at times t1, t3, t5, t7, t9, t11, t13 and t15 at which the clock VCOCLK (a) falls.

At time t1, the Q output signal (c) of the D-FF 53 has the "H" level, and therefore, the level of the Q output signal (d) of the D-FF 54 changes to the "H" level and remains at the "H" level until the next falling timing t3 of the clock VCOCLK (a). At time t3, since the Q output signal (c) of the D-FF 53 has the "L" level, the D-FF 54 fetches the "L" level, and consequently, the level of the Q output signal (d) thereof changes from the "H" level to the "L" level. Then, the Q output signal (d) maintains the "L" level until immediately before time t7 past time t5.

At the falling timing of the clock VCOCLK (a) at time t7, since the Q output signal (c) of the D-FF 53 has the "H" level, the level of the Q output signal (d) of the D-FF 54 changes to the "H" level because the D-FF 54 fetches the "H" level of the Q output signal (c). At time t9, the Q output signal (c) of the D-FF 53 does not change, but at time t10, the level of the Q output signal (c) changes to the "L" level and thereafter remains at the "L" level until time t12. At time t11, the Q output signal (c) of the D-FF 53 has the "L" level, and since the D-FF 54 fetches the "L" level, the level of the Q output signal (d) thereof changes from the "H" level to the "L" level.

At time t13, since the Q output signal (c) of the D-FF 53 has the "H" level, the D-FF 54 fetches the "H" level and the level of the Q output signal (d) thereof changes from the "L" level to the "H" level. The "H" level is kept until the next falling timing t15 of the clock VCOCLK (a), and at time t15, the "L" level of the Q output signal (c) of the D-FF 53 is fetched into the D-FF 54. Consequently, the level of the Q output signal (d) of the D-FF 54 changes from the "H" level to the "L" level.

Operation of the EX-OR gate 55 that generates the UP pulse signal (e) will now be described with reference to the timing chart of FIG. 9. It is to be noted that the input signal DATA (b) and the Q output signal (c) of the D-FF 53 are supplied to the input terminals A and B of the EX-OR gate 55, respectively.

The logic values of the input signal DATA (b) and the Q output signal (c) of the D-FF 53 are different from each other within the period after a point of time at which the level of the input signal DATA (b) changes from the "H" level to the "L" level between times t1 and t2 until time t2 at which the Q output signal (c) of the D-FF 53 exhibits the "H" level, the period after a point of time at which the level of the input signal DATA (b) changes from the "L" level to the "H" level between times t5 and t6 until time t6 at which the level of the Q output signal (c) of the D-FF 53 changes from the "L" level to the "H" level, the period after a point of time at which the level of the input signal DATA (b) changes from the "H" level to the "L" level between times t8 and t9 until time t10, the period after a point of time at which the level of the input signal DATA (b) changes from the "L" level to the "H" level between times t10 and t11 until time t12, and the period after a point of time at which the level of the input signal DATA (b) changes from the "H" level to the "L" level between times t12 and t13 until time t14.

Within the periods specified as above, the output signal (e) of the EX-OR gate 55 exhibits the "H" level. Within other periods, since both of the signal levels of the input signal DATA (b) and the Q output signal (c) of the D-FF 53 are either the "H" level or the "L" level, the output signal (e) of the EX-OR gate 55 has the "L" level. The output signal (e) of the EX-OR gate 55 is used as the UP pulse signal.

Operation of the EX-OR gate 56 that generates the DOWN pulse signal (f) will now be described with reference to the timing chart of FIG. 9. It is to be noted that the Q output signal (c) of the D-FF 53 and the Q output signal (d) of the D-FF 54 are supplied to the input terminals A and B of the EX-OR gate 56, respectively.

The logical values of the Q output signal (c) of the D-FF 53 and the Q output signal (d) of the D-FF 54 are different from each other within the period from time t2 to time t3, the period from time t6 to time t7, the period from time t10 to time t11 the period from time t12 to time t13, and the period from time t14 to time t15.

Within the periods specified as above, the output signal (f) of the EX-OR gate 56 exhibits the "H" level. Within other periods, since both of the signal levels of the Q output signal (c) of the D-FF 53 and the Q output signal (d) of the D-FF 54 are either the "H" level or the "L" level, the output signal (f) of the EX-OR gate 56 has the "L" level. The output signal (f) of the EX-OR gate 56 is used as the DOWN pulse signal.

In this manner, each time the input signal DATA changes, each of the pulse waveforms of the UP pulse signal (e) and the DOWN pulse signal (f) is generated once. According to this exemplary circuit embodiment, the pulse width of the DOWN pulse signal (f) is always fixed, and phase control is performed by adjusting the pulse width of the UP pulse signal (e).

Figure 10:
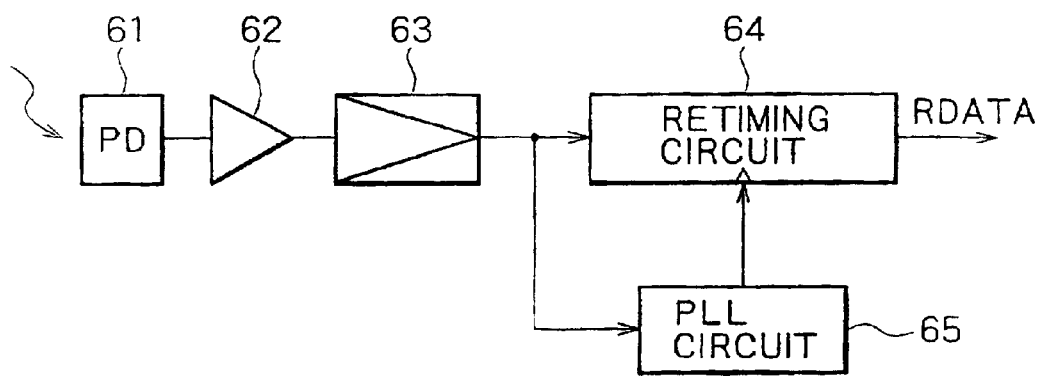
FIG. 10 is a block diagram showing part of an optical communication reception apparatus to which the present invention is applied.
Figure 11:
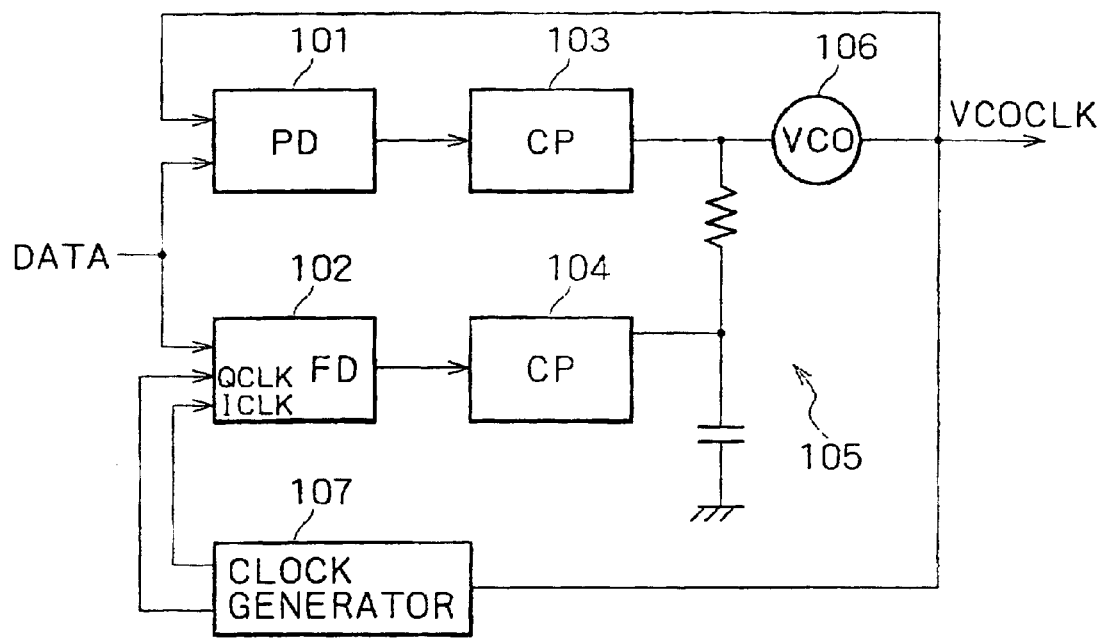
FIG. 11 is a block diagram showing a basic configuration of a PLL circuit.
Figure 12:
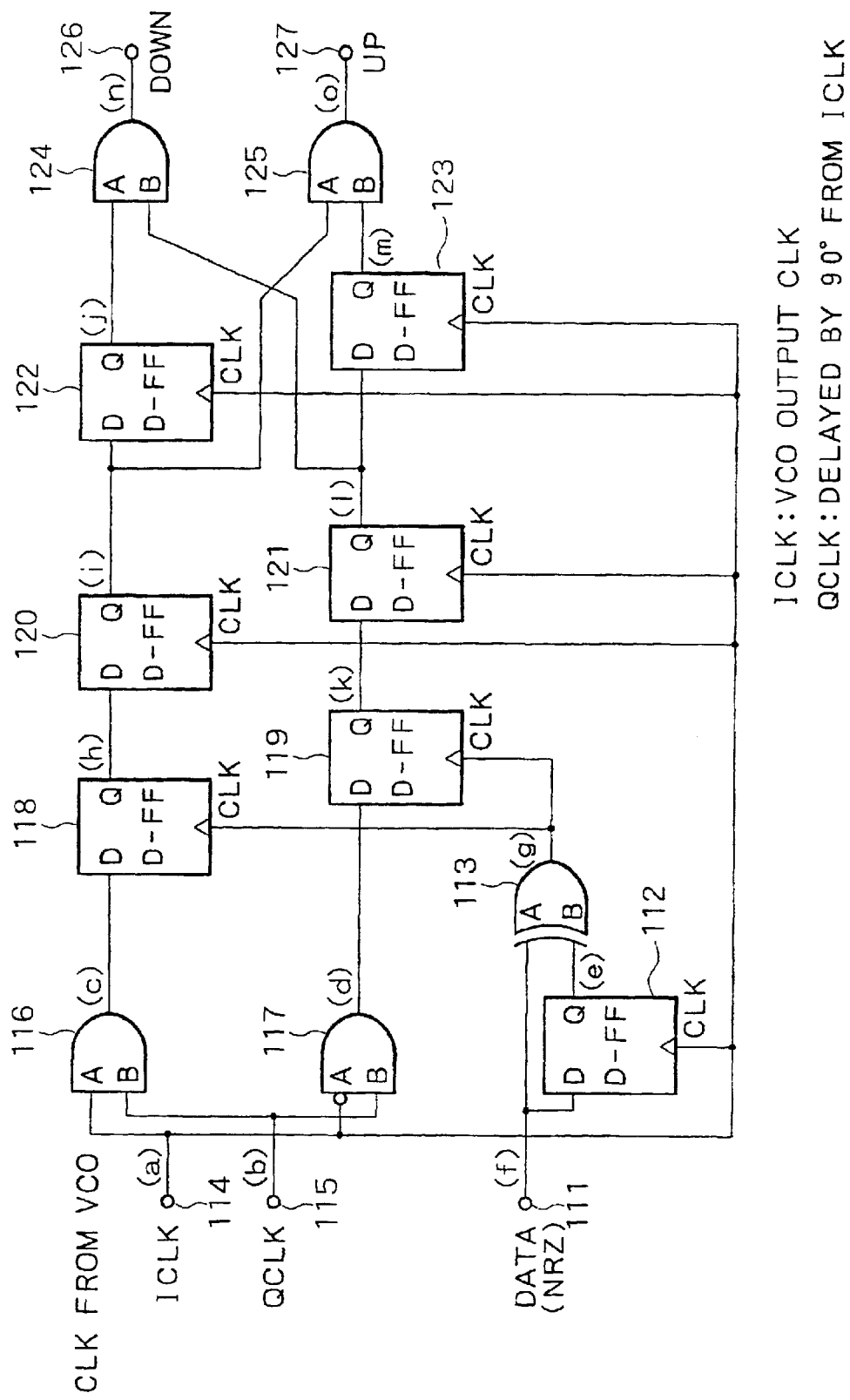
FIG. 12 is a block diagram showing a conventional frequency detection circuit.
Figure 13:
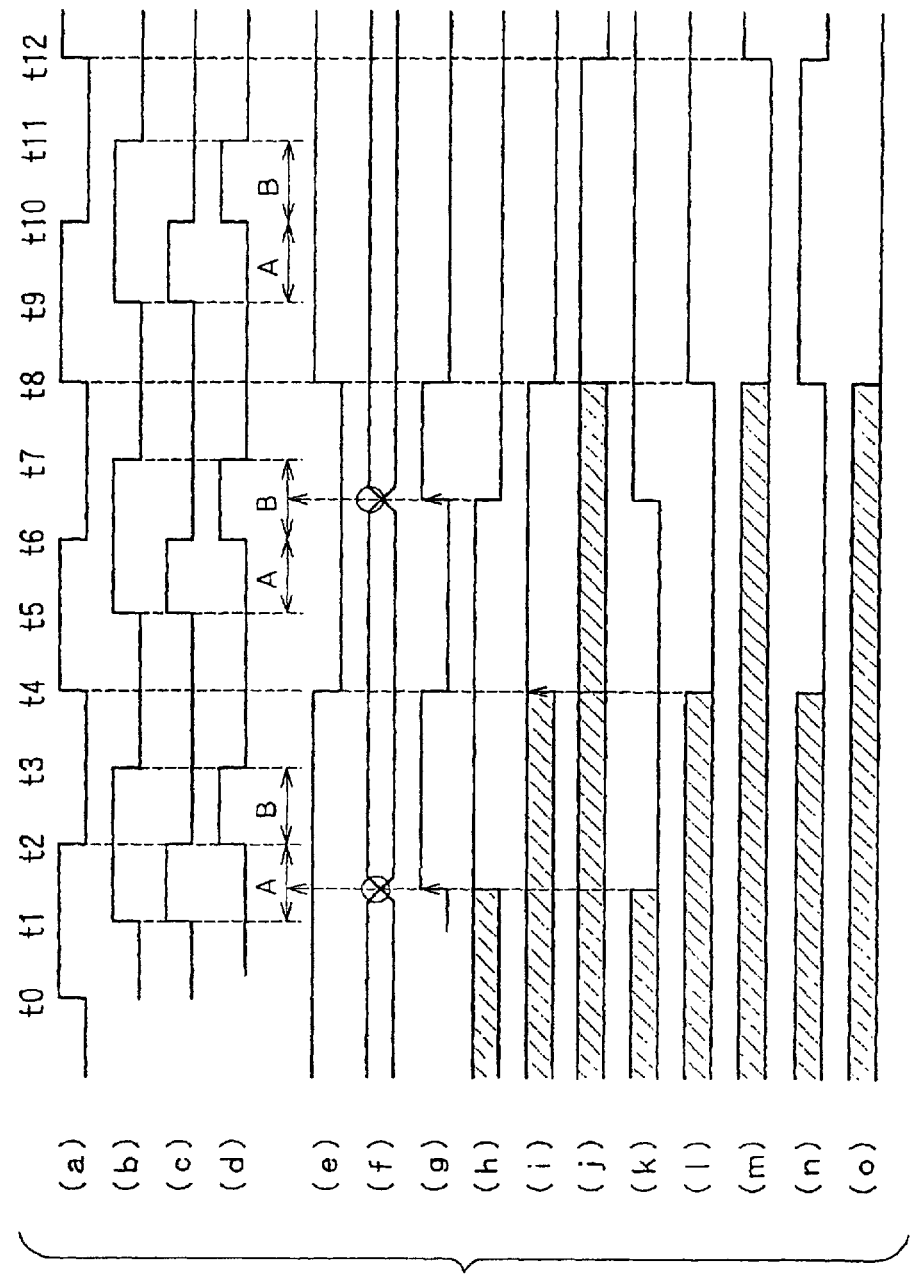
FIG. 13 is a timing chart illustrating circuit operation of the frequency detection circuit of FIG. 12.

FIG. 10 is a block diagram showing an example of a configuration of an optical communication reception apparatus to which the present invention is applied. Referring to FIG. 10, an optical signal is received and converted into an electric signal by a photo-detector (PD) 61 and is extracted as signal current from the photo-detector 61. The signal current is converted into a signal voltage by an I (current) to V (voltage) conversion circuit 62, amplified by an amplifier 63 and supplied to a retiming circuit 64 and a PLL circuit 65.

The PLL circuit 65 extracts, from the received data supplied thereto from the amplifier 63, a clock component included in the received data and produces and supplies a new clock signal having a phase synchronized with the clock component to the retiming circuit 64. The PLL circuit 10 (10') described hereinabove can be used for the PLL circuit 65. The retiming circuit 64 retimes (a kind of waveform shaping) the received data supplied thereto from the amplifier 63 based on the clock signal supplied thereto from the PLL circuit 65 and outputs the retimed received data.

Where the PLL circuit to which the present invention is applied is used as the PLL circuit 65 of the reception apparatus for use with optical communication in which, for example, NRZ digital data are used in this manner, even if the duty ratio of the input signal to the PLL circuit varies, a stabilized PLL operation can be achieved. Consequently, the PLL circuit 65 does not malfunction with data of a transmission signal that is liable to suffer from duty distortion, and accordingly, the retiming processing by the retiming circuit 64 can be performed with a higher degree of certainty.

It is to be noted that, while the present invention is applied to a reception apparatus for optical communication, the application of the present invention is not limited to this, but the present invention can be applied particularly to processing systems that process data that are liable to duty distortion.

While a preferred embodiment of the present invention has been described using specific terms, such description is for illustrative purposes only, and it is to be understood that changes and variations may be made without departing from the spirit or scope of the following claims.

What is claimed is:

1. A PLL circuit, comprising:
   an oscillator for generating an oscillation frequency signal having a variable oscillation frequency;
   a phase detection circuit for comparing the phases of the oscillation frequency signal of said oscillator and an input signal with each other and outputting, based on a result of the comparison, a first phase control signal for advancing the phase of the oscillation frequency signal of said oscillator or a second phase control signal for delaying the phase of the oscillation frequency signal of said oscillator;
   a signal generation circuit for generating first and second signals having different phases from each other based on the oscillation frequency signal of said oscillator; and
   a frequency detection circuit for fetching the first and second signals generated by said signal generation circuit in synchronism with the input signal for each period of the input signal, logically operating the fetched signals and signals having been fetched in the immediately preceding period and outputting, based on a result of the arithmetic operation, a first frequency control signal for raising the frequency of the oscillation frequency signal of said oscillator or a second frequency control signal for lowering the frequency of the oscillation frequency signal of said oscillator.

2. A PLL circuit according to claim 1, wherein the first and second signals are clock signals.

3. A PLL circuit according to claim 2, wherein the phases of the first and second signals differ from each other by 90 degrees.

4. A PLL circuit according to claim 1, wherein said frequency detection circuit includes a first sampling circuit for fetching the first signal in synchronism with the input signal for each period of the input signal, a second sampling circuit for fetching the second signal in synchronism with the input signal for each period of the input signal, and a control logic circuit for storing the signals fetched by said first and second sampling circuits, logically operating the stored signals and the signals fetched subsequently by said first and second sampling circuits and generating, based on a result of the logical operation, the first frequency control signal or the second frequency control signal.

5. A PLL circuit according to claim 4, wherein said control logic circuit includes a first logical operation circuit for logically operating output signals of said first and second sampling circuits, a first storage circuit for storing an output signal of said first logical operation circuit, a second logical operation circuit for logically operating the output signals of said first and second sampling circuits and the stored signal of said first storage circuit, a third logical operation circuit for logically operating a signal obtained by logical processing of the output signals of said first and second sampling circuit and the stored signal of said first storage circuit, second storage means for storing an output signal of said second logical operation circuit, and third storage means for storing an output signal of said third logical operation circuit.

6. A PLL circuit according to claim 5, wherein each of said first, second and third logical operation circuits includes an OR circuit.

7. A PLL circuit according to claim 5, wherein each of said first, second and third storage circuits includes a flip-flop circuit.

8. A PLL circuit according to claim 7, wherein said flip-flop circuit is a D-type flip-flop.

9. A PLL circuit according to claim 4, wherein said first and second sampling circuits sample the first and second signals, respectively, at a timing of a rising edge or a falling edge of the input signal.

10. A PLL circuit according to claim 4, wherein each of said first and second sampling circuits includes a flip-flop circuit.

11. A PLL circuit according to claim 10, wherein said flip-flop is a D-type flip-flop.

12. A PLL circuit according to claim 11, wherein the D-type flip-flops fetch the first and second signals at a timing of a rising edge of a clock input thereto.

13. An optical communication reception apparatus, comprising:
   light reception means for receiving an optical signal, converting the optical signal into an electric signal and outputting the electric signal;
   a PLL circuit for producing a clock signal synchronized with the output signal of said light reception means; and a retiming circuit for retiming the output signal of said light reception means based on the clock signal produced by said PLL circuit;

said PLL circuit including an oscillator for generating an oscillation frequency signal having a variable oscillation frequency, a phase detection circuit for comparing the phases of the oscillation frequency signal of said oscillator and an input signal with each other and outputting, based on a result of the comparison, a first phase control signal for advancing the phase of the oscillation frequency signal of said oscillator or a second phase control signal for delaying the phase of the oscillation frequency signal of said oscillator, a signal generation circuit for generating first and second signals having different phases from each other based on the oscillation frequency signal of said oscillator, and a frequency detection circuit for fetching the first and second signals generated by said signal generation circuit in synchronism with the input signal for each period of the input signal, logically operating the fetched signals and signals having been fetched in the immediately preceding period and outputting, based on a result of the arithmetic operation, a first frequency control signal for raising the frequency of the oscillation frequency signal of said oscillator or a second frequency control signal for lowering the frequency of the oscillation frequency signal of said oscillator.

14. An optical communication reception apparatus according to claim 13, wherein the first and second signals are clock signals.

15. An optical communication reception apparatus according to claim 14, wherein the phases of the first and second signals differ from each other by 90 degrees.

16. An optical communication reception apparatus according to claim 13, wherein said frequency detection circuit includes a first sampling circuit for fetching the first signal in synchronism with the input signal for each period of the input signal, a second sampling circuit for fetching the second signal in synchronism with the input signal for each period of the input signal, and a control logic circuit for storing the signals fetched by said first and second sampling circuits, logically operating the stored signals and the signals fetched subsequently by said first and second sampling circuits and generating, based on a result of the logical operation, the first frequency control signal or the second frequency control signal.

17. An optical communication reception apparatus according to claim 16, wherein said control logic circuit includes a first logical operation circuit for logically operating output signals of said first and second sampling circuits, a first storage circuit for storing an output signal of said first logical operation circuit, a second logical operation circuit for logically operating the output signals of said first and second sampling circuits and the stored signal of said first storage circuit, a third logical operation circuit for logically operating a signal obtained by logical processing of the output signals of said first and second sampling circuit and the stored signal of said first storage circuit, second storage means for storing an output signal of said second logical operation circuit, and third storage means for storing an output signal of said third logical operation circuit.

18. An optical communication reception apparatus according to claim 16, wherein said first and second sampling circuits sample the first and second signals, respectively, at a timing of a rising edge or a falling edge of the input signal.

* * * * *